(12) United States Patent
Kim et al.

(10) Patent No.: US 11,309,373 B2
(45) Date of Patent: Apr. 19, 2022

(54) DISPLAY DEVICE AND METHOD OF MANUFACTURING THE SAME

(71) Applicant: Samsung Display Co., Ltd., Yongin-si (KR)

(72) Inventors: Keun Woo Kim, Yongin-si (KR); Yong Su Lee, Yongin-si (KR); Myoung Geun Cha, Yongin-si (KR); Doo Na Kim, Yongin-si (KR); Sang Sub Kim, Yongin-si (KR); Jae Hwan Chu, Yongin-si (KR); Sang Gun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/838,931

(22) Filed: Apr. 2, 2020

(65) Prior Publication Data

US 2021/0036079 A1 Feb. 4, 2021

(30) Foreign Application Priority Data

Jul. 30, 2019 (KR) .................... 10-2019-0092495

(51) Int. Cl.
*H01L 27/32* (2006.01)
*H01L 27/12* (2006.01)

(52) U.S. Cl.
CPC ...... *H01L 27/3262* (2013.01); *H01L 27/3248* (2013.01); *H01L 27/1233* (2013.01); *H01L 27/1251* (2013.01); *H01L 27/1274* (2013.01); *H01L 27/1288* (2013.01); *H01L 2227/323* (2013.01)

(58) Field of Classification Search
CPC ............ H01L 27/3262; H01L 27/3248; H01L 27/1233; H01L 2227/323
USPC .......................................... 257/72
See application file for complete search history.

(56) References Cited

U.S. PATENT DOCUMENTS

| 8,314,758 B2 | 11/2012 | Goh et al. |
| 2002/0021268 A1* | 2/2002 | Yamazaki ........... H01L 27/3211 345/80 |
| 2004/0130262 A1 | 7/2004 | Yoneda |

(Continued)

FOREIGN PATENT DOCUMENTS

| JP | 2011-112723 A | 6/2011 |
| KR | 10-0558243 B1 | 3/2006 |

(Continued)

*Primary Examiner* — Dzung Tran
(74) *Attorney, Agent, or Firm* — Lewis Roca Rothgerber Christie LLP

(57) ABSTRACT

A display device includes: a pixel at a display region. The pixel includes: a light-emitting element connected between a first power source and a second power source; and a first transistor connected between the first power source and the light-emitting element, the first transistor to control a driving current of the light-emitting element in response to a voltage of a first node. The first transistor includes a first driving transistor and a second driving transistor that are connected in series with each other between the first power source and the light-emitting element, and the first driving transistor and the second driving transistor have structures that are asymmetric with each other in a cross-sectional view.

12 Claims, 16 Drawing Sheets

(56) References Cited

U.S. PATENT DOCUMENTS

| | | | |
|---|---|---|---|
| 2005/0259051 A1* | 11/2005 | Lee | G09G 3/3233 |
| | | | 345/76 |
| 2006/0066530 A1* | 3/2006 | Azami | G09G 3/3266 |
| | | | 345/76 |
| 2008/0017866 A1* | 1/2008 | Sato | H01L 29/786 |
| | | | 257/72 |
| 2011/0043513 A1* | 2/2011 | Yamazaki | H01L 27/1214 |
| | | | 345/212 |
| 2011/0122324 A1 | 5/2011 | Yamashita et al. | |
| 2017/0047003 A1 | 2/2017 | Kim et al. | |
| 2018/0158406 A1 | 6/2018 | Kim et al. | |

FOREIGN PATENT DOCUMENTS

| | | |
|---|---|---|
| KR | 10-1458911 B1 | 11/2014 |
| KR | 10-2017-0020571 A | 2/2017 |

\* cited by examiner

FIG. 9D
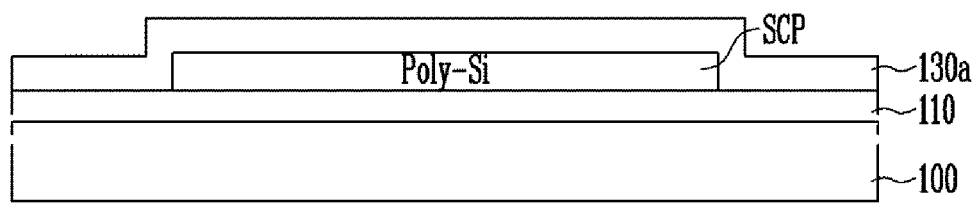
FIG. 9E
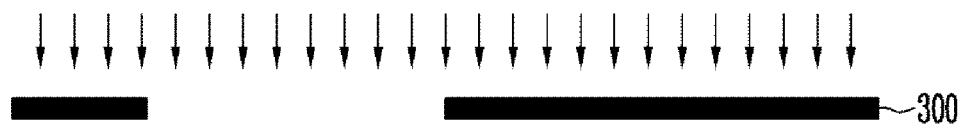
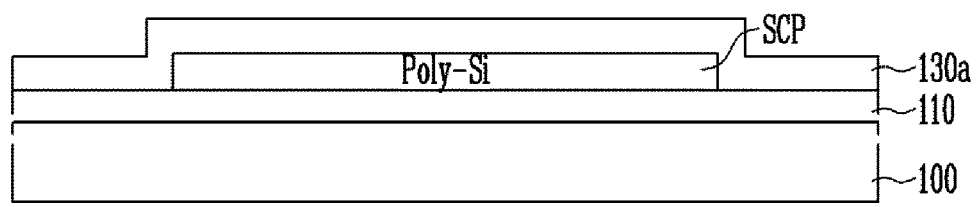
FIG. 9F
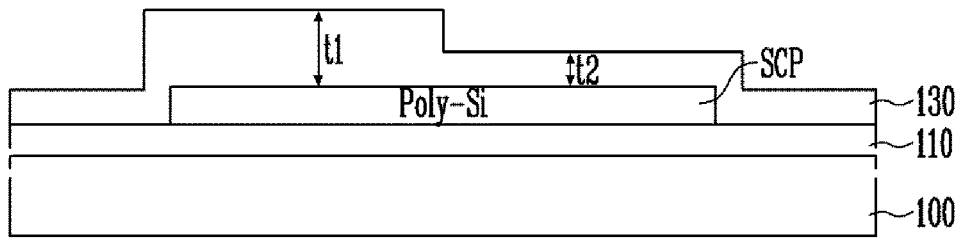

DISPLAY DEVICE AND METHOD OF MANUFACTURING THE SAME

CROSS-REFERENCE TO RELATED APPLICATION

This application claims priority to and the benefit of Korean Patent Application No. 10-2019-0092495 filed in the Korean Intellectual Property Office on Jul. 30, 2019, the entire contents of which are incorporated herein by reference.

BACKGROUND

1. Field

One or more embodiments of the present invention relate to a display device and a method of manufacturing the same.

2. Description of the Related Art

Display devices display an image using pixels disposed in a display region. The pixels may be connected to scan lines and data lines, and may include a plurality of transistors. For example, a pixel of an active light-emitting display device may include a light-emitting element, a driving transistor, and at least one switching transistor.

The luminance of the pixel may be variously changed according to the magnitude of a driving current flowing through the light-emitting element. The driving current is controlled by the driving transistor. In order to uniformly control the luminance of the pixel in accordance with each gray level, and to more finely express the gray level, a driving range of the driving transistor should be sufficiently secured.

The above information disclosed in this Background section is for enhancement of understanding of the background of the invention, and therefore, it may contain information that does not constitute prior art.

SUMMARY

One or more exemplary embodiments of the present invention are directed to a display device in which a driving range of a driving transistor may be sufficiently secured, and an area occupied by the driving transistor may be reduced. One or more exemplary embodiments of the present invention are directed to a method of manufacturing the display device in which the driving range of the driving transistor may be sufficiently secured, and the area occupied by the driving transistor may be reduced.

According to an exemplary embodiment of the present invention, a display device includes: a pixel at a display region. The pixel includes: a light-emitting element connected between a first power source and a second power source; and a first transistor connected between the first power source and the light-emitting element, the first transistor to control a driving current of the light-emitting element in response to a voltage of a first node. The first transistor includes a first driving transistor and a second driving transistor that are connected in series with each other between the first power source and the light-emitting element, and the first driving transistor and the second driving transistor have structures that are asymmetric with each other in a cross-sectional view.

In an exemplary embodiment, at least one of a thickness of a channel region and a thickness of a gate insulating film of the first driving transistor may be different from that of the second driving transistor.

In an exemplary embodiment, the first transistor may include: a first channel region; a first conductive region and a second conductive region at opposite sides of the first channel region from each other; a second channel region spaced from the first channel region with the second conductive region interposed therebetween; a third conductive region spaced from the second conductive region with the second channel region interposed therebetween; a first gate electrode overlapping the first channel region with a first insulating film interposed therebetween; and a second gate electrode overlapping the second channel region with the first insulating film interposed therebetween.

In an exemplary embodiment, the first driving transistor may include a first active layer pattern, and may be connected between the first power source and the second driving transistor, the first active layer pattern including the first channel region, the first conductive region, and the second conductive region.

In an exemplary embodiment, the second driving transistor may include a second active layer pattern, and may be connected between the first driving transistor and the light-emitting element, the second active layer pattern including the second channel region, the second conductive region, and the third conductive region.

In an exemplary embodiment, the first insulating film may have a first thickness between the first channel region and the first gate electrode, and a second thickness between the second channel region and the second gate electrode, the second thickness being less than the first thickness.

In an exemplary embodiment, a thickness of the first channel region may be greater than a thickness of the second channel region.

In an exemplary embodiment, a length of the first channel region may be greater than a length of the second channel region.

In an exemplary embodiment, the first active layer pattern and the second active layer pattern may be integrally connected to each other through the second conductive region.

In an exemplary embodiment, the first gate electrode and the second gate electrode may be commonly connected to the first node.

In an exemplary embodiment, the first transistor may further include: a first electrode connected to the first conductive region; and a second electrode connected to the third conductive region.

In an exemplary embodiment, the pixel may further include at least one switching transistor configured to transmit a data signal or a voltage of an initialization power source to the first node.

In an exemplary embodiment, the switching transistor may include a plurality of transistors connected in series with each other.

According to an exemplary embodiment of the present invention, a method of manufacturing a display device is provided. The display device includes a pixel including a first driving transistor and a second driving transistor connected in series with each other. The method includes: forming a semiconductor pattern on a base layer; forming a first insulating film on the semiconductor pattern; and forming a first gate electrode and a second gate electrode on the first insulating film to overlap different regions of the semiconductor pattern. The first driving transistor and the second driving transistor are formed to have structures that are asymmetric with each other in a cross-sectional view.

In an exemplary embodiment, at least one of the semiconductor pattern and the first insulating film may be formed to have a different thickness for a region corresponding to where the first driving transistor is to be formed from that of a region corresponding to where the second driving transistor is to be formed.

In an exemplary embodiment, the first insulating film may be formed to have a first thickness at the region corresponding to where the first driving transistor is to be formed, and a second thickness at the region corresponding to where the second driving transistor is to be formed, the first thickness being greater than the second thickness.

In an exemplary embodiment, the semiconductor pattern may be formed to have a third thickness at the region corresponding to where the first driving transistor is to be formed, and a fourth thickness at the region corresponding to where the second driving transistor is to be formed, the third thickness being greater than the fourth thickness.

In an exemplary embodiment, the forming of the first insulating film may include: forming an insulating material layer by applying an insulating material to cover the semiconductor pattern; placing a mask on the insulating material layer to expose the region corresponding to where the first driving transistor is to be formed; and applying an additional amount of the insulating material on the semiconductor pattern at the region corresponding to where the first driving transistor is to be formed.

In an exemplary embodiment, the forming of the semiconductor pattern may include: forming a semiconductor material layer by applying a semiconductor material on the regions corresponding to where the first driving transistor and the second driving transistor are to be formed; placing a mask on the semiconductor material layer to expose the region corresponding to where the first driving transistor is to be formed; and applying an additional amount of the semiconductor material on the region corresponding to where the first driving transistor is to be formed.

In an exemplary embodiment, the method may further include: crystallizing the semiconductor pattern; and selectively doping impurities into different regions of the semiconductor pattern.

BRIEF DESCRIPTION OF THE DRAWINGS

The above and other aspects and features of the present invention will be more clearly understood from the following detailed description of the illustrative, non-limiting exemplary embodiments with reference to the accompanying drawings.

FIGS. 9A-9J illustrate a method of manufacturing a display device according to an exemplary embodiment of the present invention.

DETAILED DESCRIPTION

Figure 1:
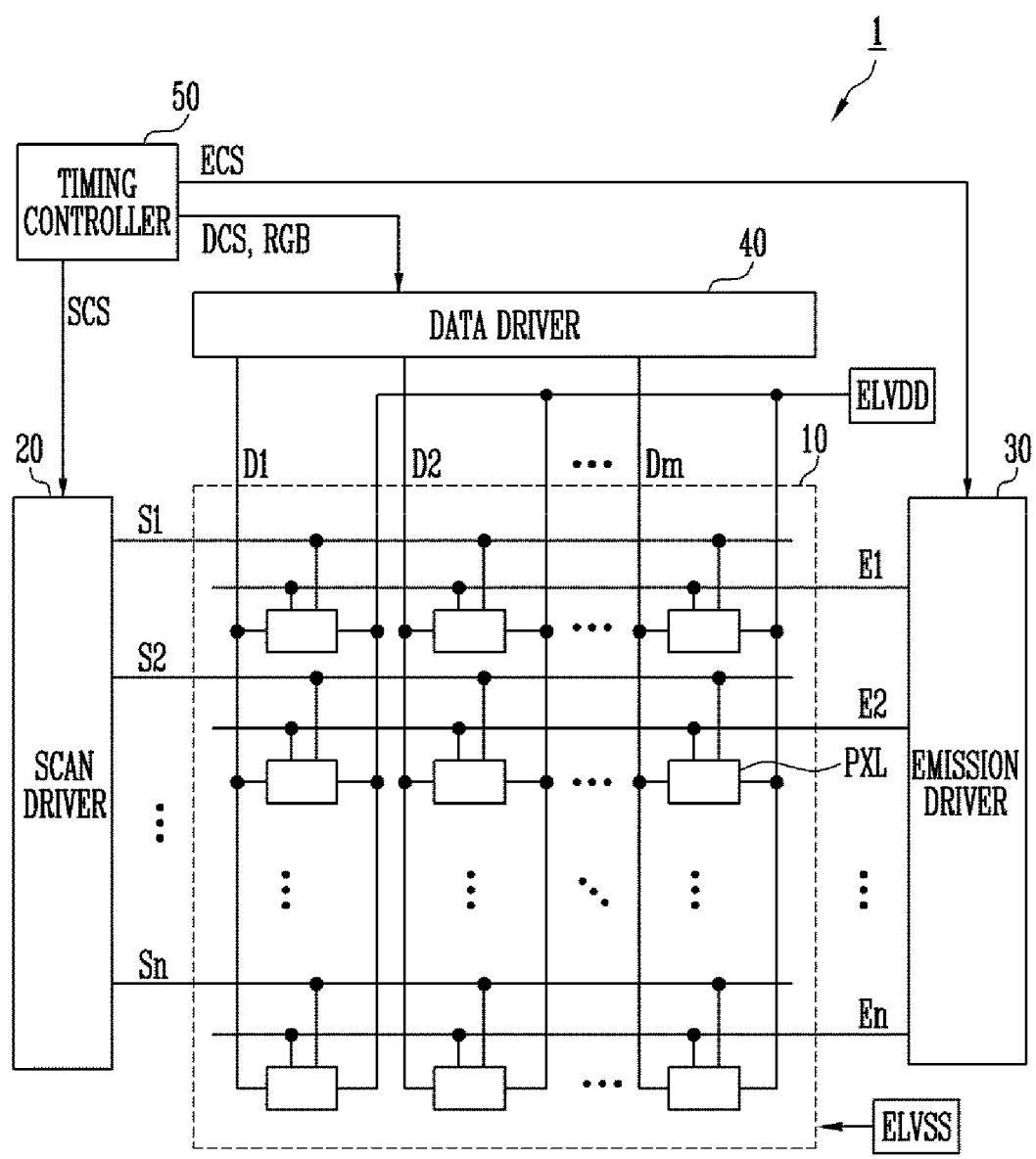
FIG. 1 illustrates a display device according to an exemplary embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 illustrates a display device 1 according to an exemplary embodiment of the present invention. Although FIG. 1 illustrates a light-emitting display device including light-emitting elements as an example of the display device 1, the display device 1 according to the present invention is not limited thereto.

Referring to FIG. 1, the display device 1 according to an exemplary embodiment of the present invention may include a display region 10 at (e.g., in or on) which a plurality of pixels PXL are disposed, a scan driver 20 configured to drive the pixels PXL, an emission control driver 30, a data driver 40, and a timing controller 50.

The display region 10 includes the pixels PXL that are connected to scan lines S1 to Sn, emission control lines E1 to En, and data lines D1 to Dm. As used in this specification, the term "connection" may inclusively refer to an electrical and/or a physical connection. For example, the pixels PXL may be electrically connected to the scan lines S1 to Sn, the emission control lines E1 to En, and the data lines D1 to Dm.

However, the present invention is not limited thereto, and according to other exemplary embodiments, the emission control lines E1 to En may be omitted. For example, the emission control lines E1 to En may be selectively (e.g., optionally) provided according to (e.g., depending on) the structure and/or driving method of the pixels PXL. In this case, the display device 1 may not include the emission control driver 30 when the emission control lines E1 to En are omitted.

According to one or more exemplary embodiments, the pixels PXL may be further connected to at least one control line. In this case, the operations of the pixels PXL may be controlled by a control signal supplied from the control line.

The pixels PXL receive scan signals, emission control signals, and data signals from the scan lines S1 to Sn, the emission control lines E1 to En, and the data lines D1 to Dm, respectively. In addition, the pixels PXL may be connected to a first power source ELVDD and a second power source ELVSS to receive operation power (e.g., power to operate the pixels PXL). In some embodiments, the pixels PXL may be further connected to other power sources (for example, an initialization power source) according to (e.g., depending on) the structure and/or driving method thereof.

When the scan signal is supplied from each of the scan lines S1 to Sn, the above-described pixels PXL receive corresponding ones of the data signals from the data lines D1 to Dm, and emit light having a luminance corresponding to the corresponding data signals. Accordingly, an image corresponding to the data signals of each frame is displayed at (e.g., in or on) the display region 10.

Each pixel PXL may include a light-emitting element and a pixel circuit for driving the light-emitting element. The pixel circuit controls a driving current flowing from the first power source ELVDD to a second power source ELVSS in response to the data signal. Accordingly, the pixel circuit may include a driving transistor and at least one switching transistor.

The scan driver 20 receives a scan driving control signal SCS from the timing controller 50, and supplies scan signals to the scan lines S1 to Sn in response to the scan driving control signal SCS. For example, the scan driver 20 may supply (e.g., sequentially supply) the scan signals to the scan lines S1 to Sn in response to the scan driving control signal SCS. When the scan signals are supplied to the scan lines S1 to Sn, the pixels PXL connected to the scan lines are selected by the scan signals.

According to one or more exemplary embodiments, the scan signals may be used to select the pixels PXL of a horizontal line or row (e.g., in a horizontal line unit). For example, the scan signal may have a gate-on voltage (e.g., a low voltage) by which a transistor (e.g., the at least one switching transistor) of each of the pixels PXL that are connected to the data lines D1 to Dm may be turned on. The scan signals may be supplied to the pixels PXL of a horizontal line corresponding to each horizontal period. During a period in which the scan signals are supplied, the pixels PXL that receive the scan signals may be connected to the data lines D1 to Dm to receive the data signals.

The emission control driver 30 receives an emission driving control signal ECS from the timing controller 50, and supplies emission control signals to the emission control lines E1 to En in response to the emission driving control signal ECS. For example, the emission control driver 30 may supply (e.g., sequentially supply) the emission control signals to the emission control lines E1 to En in response to the emission driving control signal ECS. The emission control driver 30 may be selectively (e.g., optionally) provided according to (e.g., depending on) the structure and/or driving method of the pixels PXL, and may be omitted according to other exemplary embodiments.

The emission control signal may be used to control an emission period (e.g., an emission time point and/or an emission duration time) of the pixels PXL. For example, the emission control signal may have a gate-off voltage (e.g., a high voltage) by which at least one switching transistor positioned at (e.g., on) a current path of each of the pixels PXL may be turned off. In this case, the pixel PXL that receives the emission control signal may be set to be in a non-emission state during a period in which the emission control signal is supplied, and may be set to be in an emission state during other periods (e.g., when the emission control signal is not supplied). On the other hand, when a data signal corresponding to a black gray level is supplied to at least one pixel PXL, the at least one pixel PXL may maintain or substantially maintain a non-emission state in response to the data signal corresponding to the black gray level during a corresponding frame period, even when the emission control signal having the gate-off voltage is not supplied.

The data driver 40 receives a data driving control signal DCS and image data RGB from the timing controller 50, and supplies data signals to the data lines D1 to Dm in response to the data driving control signal DCS and the image data RGB. The data signals supplied to the data lines D1 to Dm are supplied to the pixels PXL that are selected by the scan signals.

The timing controller 50 receives various timing control signals (e.g., a vertical synchronization signal, a horizontal synchronization signal, a main clock signal, and/or the like) from an external device (e.g., a host processor), and generates the scan driving control signal SCS, the emission driving control signal ECS, and the data driving control signal DCS in response to the timing control signals. The scan driving control signal SCS, the emission driving control signal ECS, and the data driving control signal DCS are supplied to the scan driver 20, the emission control driver 30, and the data driver 40, respectively.

The scan driving control signal SCS includes a first start pulse (e.g., a scan start pulse) and a first clock signal (e.g., at least one scan clock signal). The first start pulse is used to control an output timing of a first scan signal (e.g., a scan signal supplied to a first scan line S1). The first clock signal is used to shift (e.g., sequentially shift) the first start pulses.

The emission driving control signal ECS includes a second start pulse (e.g., an emission start pulse) and a second clock signal (e.g., at least one emission clock signal). The second start pulse is used to control an output timing of a first emission control signal (e.g., an emission control signal supplied to a first emission control line E1). The second clock signal is used to shift (e.g., sequentially shift) the second start pulses.

The data driving control signal DCS includes a source sampling pulse, a source sampling clock, and a source output enable signal. A sampling operation of data is controlled by the data driving control signal DCS.

The timing controller 50 receives input image data from the outside (e.g., receives externally provided input image data), and realigns the input image data to generate the image data RGB. For example, the timing controller 50 may realign the input image data from the outside according to the specification of the data driver 40, and may supply the realigned image data RGB to the data driver 40. The image data RGB supplied to the data driver 40 is used to generate a data signal (e.g., one or more data signals).

Figure 2:
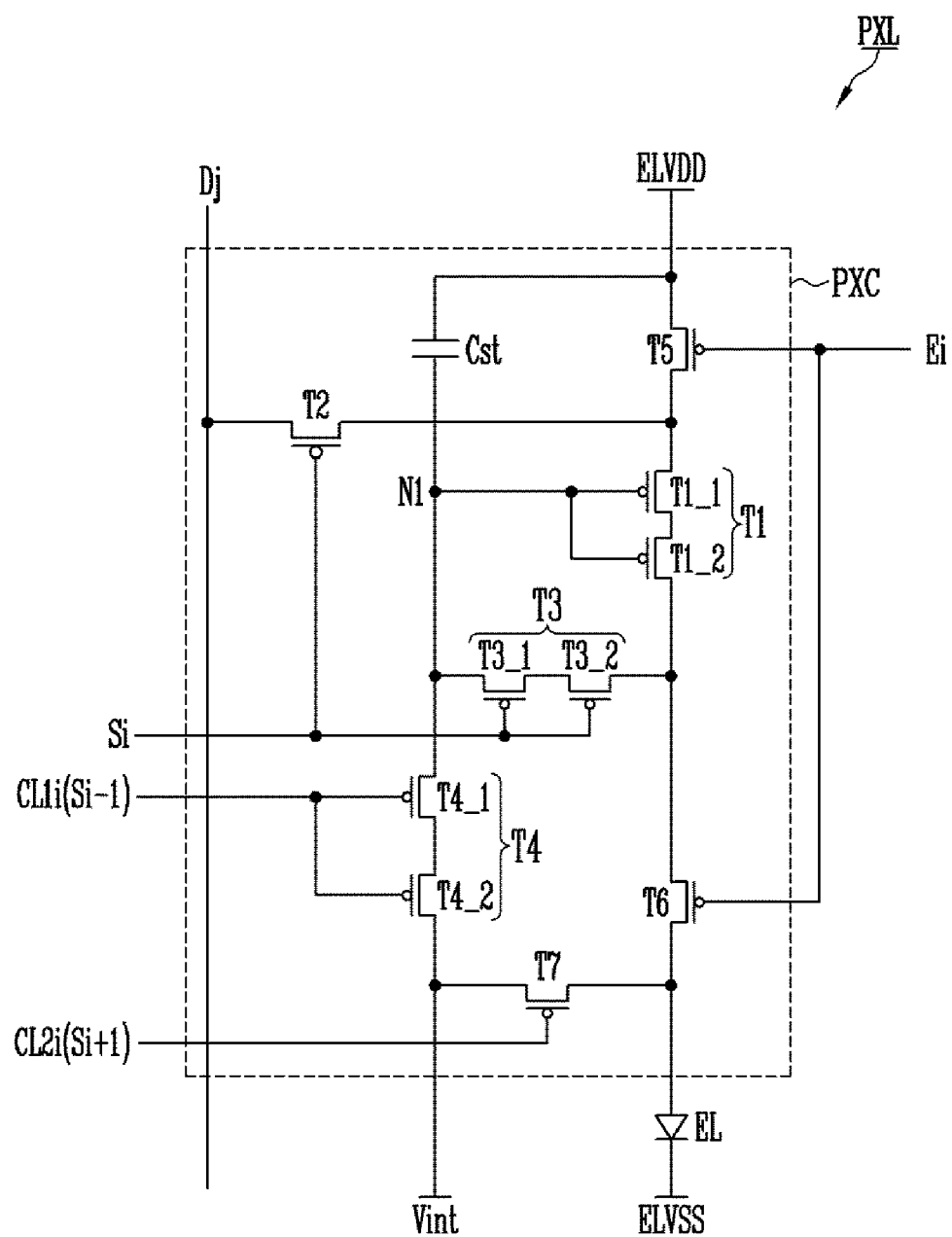
FIGS. 2 and 3 illustrate pixels according to various exemplary embodiments of the present invention.
Figure 3:
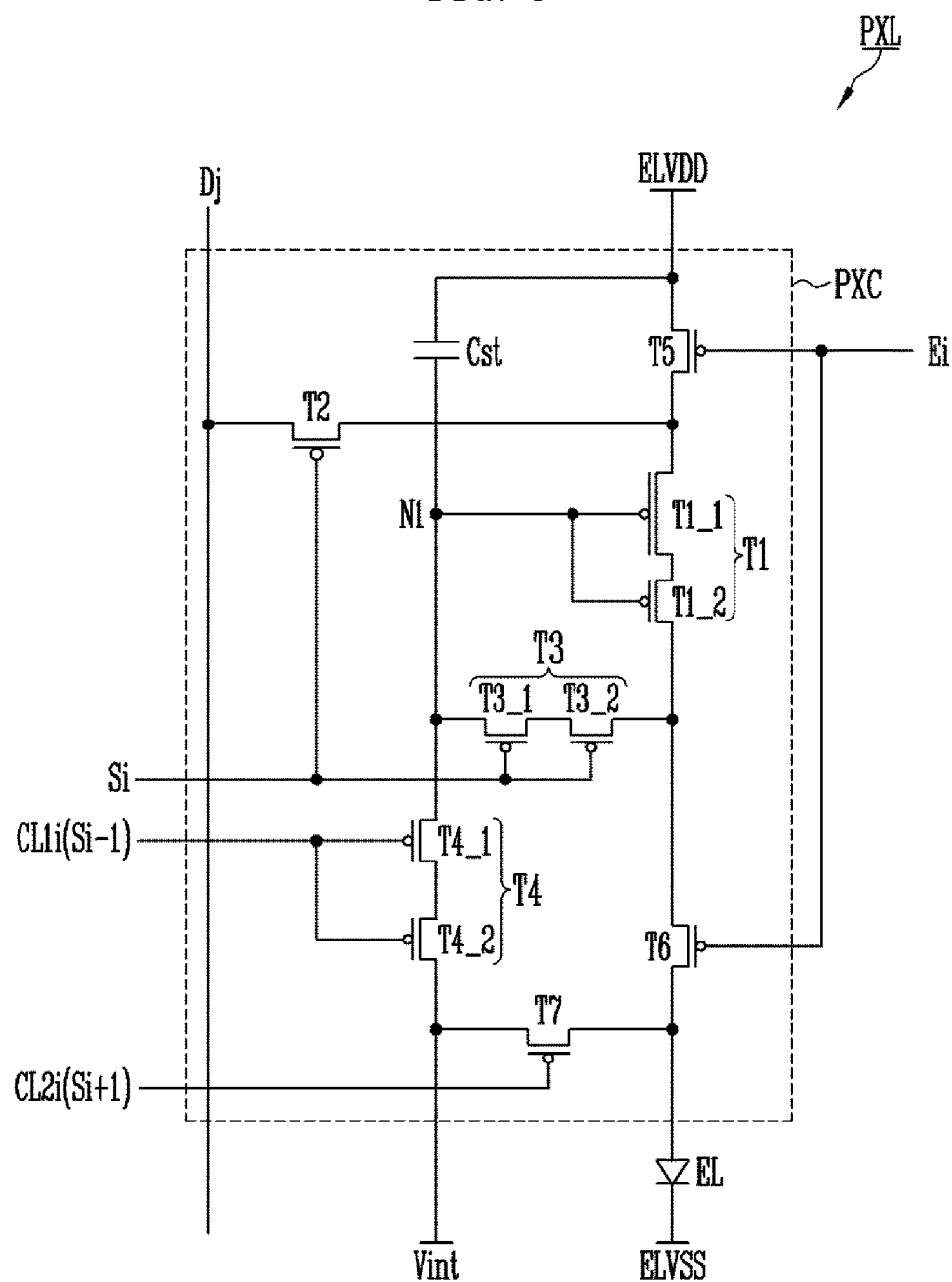

FIGS. 2 and 3 illustrate pixels PXL according to various exemplary embodiments of the present invention. For example, FIG. 2 illustrates an exemplary embodiment of a pixel PXL which may be disposed at (e.g., in or on) the display region 10 of FIG. 1, and FIG. 3 illustrates a modified exemplary embodiment of the pixel PXL shown in FIG. 2, according to another exemplary embodiment. For example, FIG. 3 illustrates an example in which a plurality of transistors corresponding to a first transistor T1 of FIG. 2 have different channel lengths from each other.

For convenience, FIGS. 2 and 3 illustrate a representative pixel PXL disposed at (e.g., in or on) an $i^{th}$ pixel row (e.g., an ith horizontal line) and a $j^{th}$ pixel column (e.g., a $j^{th}$ vertical line) of the display region 10 (where i and j are natural numbers). According to one or more exemplary embodiments, the other pixels PXL disposed at (e.g., in or on) the display region 10 may have the same or substantially the same structure as any of those of the pixels PXL shown in FIGS. 2 and 3.

In an exemplary embodiment, the pixel PXL may be connected to an $i^{th}$ scan line Si, an $i^{th}$ emission control line Ei, and a $j^{th}$ data line Dj. In some embodiments, the pixel PXL may selectively (e.g., optionally) be further connected to at least one control line. For example, the pixel PXL may be further connected to an $i^{th}$ first control line CL1$i$ and an $i^{th}$ second control line CL2$i$. For convenience of description, hereinafter, the "$i^{th}$ scan line Si," the "ith emission control line Ei," and the "$j^{th}$ data line Dj" may be referred to as a "scan line Si," an "emission control line Ei," and a "data line Dj," respectively. Similarly, the "ith first control line CL1$i$" and the "ith second control line CL2$i$" may be referred to as a "first control line CL1$i$" and a "second control line CL2$i$," respectively.

Referring to FIGS. 2 and 3, the pixel PXL according to one or more exemplary embodiments includes a light-emitting element EL and a pixel circuit PXC configured to drive the light-emitting element EL. In an exemplary embodiment, the light-emitting element EL may be connected between the pixel circuit PXC and a second power source ELVSS, but the position of the light-emitting element EL is not limited thereto. For example, in another exemplary embodiment, the light-emitting element EL may be connected between a first power source ELVDD and the pixel circuit PXC.

The light-emitting element EL is connected between the first power source ELVDD and the second power source ELVSS. For example, an anode electrode of the light-emitting element EL may be connected to the first power source ELVDD though the pixel circuit PXC, and a cathode electrode of the light-emitting element EL may be connected to the second power source ELVSS. When the light-emitting element EL receives a driving current from a first transistor T1, the light-emitting element EL generates light having a luminance corresponding to the driving current.

In an exemplary embodiment, the light-emitting element EL may be an organic light-emitting diode (OLED) including an organic light-emitting layer, but the present invention is not limited thereto. For example, in another exemplary embodiment, micro inorganic light-emitting elements having a small size ranging from a nanoscale to a microscale may constitute a light source for each pixel PXL.

The first power source ELVDD and the second power source ELVSS may have a potential difference (e.g., a difference in power levels) that enables (e.g., powers) the light-emitting element EL to emit light. For example, the first power source ELVDD may be a high potential pixel power source, and the second power source ELVSS may be a low potential pixel power source having a potential (e.g., a power level or a voltage level) that is lower than that of the first power source ELVDD by a threshold voltage or more (e.g., by a voltage level that is greater than or equal to a threshold voltage level) of the light-emitting element EL.

The pixel circuit PXC includes a driving transistor, at least one switching transistor, and a storage capacitor Cst. For example, the pixel circuit PXC may include a first transistor T1 configured as the driving transistor to control a driving current in response to a voltage of a first node N1, at least one switching transistor (e.g., a second transistor T2, a third transistor T3, and/or a fourth transistor T4) configured to transmit a data signal and/or a voltage of an initialization power source to the first node N1, and the storage capacitor Cst. In addition, according to one or more exemplary embodiments, the pixel circuit PXC may selectively (e.g., optionally) further include at least one switching transistor (e.g., a fifth transistor T5 and/or a sixth transistor T6) configured to control an emission period of the pixel PXL, and a switching transistor (e.g., a seventh transistor T7) configured to transmit the voltage of the initialization power source Vint to an electrode (e.g., one electrode) of the light-emitting element EL.

However, the present invention is not limited thereto, and the structure of the pixel circuit PXC may be variously modified according to other exemplary embodiments. For example, the pixel PXL may include a pixel circuit PXC having various suitable structures and/or various suitable driving methods that are known to those having ordinary skill in the art.

In an exemplary embodiment, each of the first to seventh transistors T1 to T7 may be a p-type transistor. However, the present invention is not limited thereto. For example, in an exemplary embodiment, each of the first to seventh transistors T1 to T7 may be an n-type transistor. In another example, in another exemplary embodiment, some of (e.g., at least one of) the first to seventh transistors T1 to T7 may be p-type transistors, and others (e.g., at least one of the others) thereof may be n-type transistors. In this case, a gate-on voltage for turning on the n-type transistor may be a high voltage (e.g., a high level voltage).

In addition, a voltage of a data signal may be determined according to (e.g., depending on) the type of the first transistor T1. For example, when the first transistor T1 is a p-type transistor, as a gray level to be expressed becomes higher, a data signal having a lower voltage (e.g., a lower voltage level) may be supplied to each pixel PXL. On the other hand, when the first transistor T1 is an n-type transistor, as a gray level to be expressed becomes higher, a data signal having a higher voltage (e.g., a higher voltage level) may be supplied to each pixel PXL.

That is, according to one or more exemplary embodiments of the present invention, the types of the transistors included in (e.g., constituting) the pixel PXL and the voltage levels of the various control signals (e.g., a scan signal, a data signal, a first control signal, a second control signal, and/or an emission control signal) for controlling the transistors may be variously modified according to various exemplary embodiments.

The first transistor T1 is connected between the first power source ELVDD and the second power source ELVSS to be positioned on a current path of a driving current. For example, the first transistor T1 may be connected between the first power source ELVDD and the light-emitting element EL. For example, a first electrode (e.g., a source electrode) of the first transistor T1 may be connected to the first power source ELVDD through the fifth transistor T5, and a second electrode (e.g., a drain electrode) of the first transistor T1 may be connected to the light-emitting element EL through the sixth transistor T6. A gate electrode of the first transistor T1 is connected to the first node N1.

The above-described first transistor T1 may be a driving transistor that controls a driving current flowing in (e.g., through) the light-emitting element EL in response to a gate voltage, for example, a voltage of the first node N1. For example, during an emission period of a frame (e.g., each frame), the first transistor T1 may control a driving current that flows from the first power source ELVDD to the second power source ELVSS through the light-emitting element EL in response to the voltage of the first node N1.

In one or more exemplary embodiments of the present invention, the first transistor T1 may include a plurality of transistors that are connected in series with each other. For example, the first transistor T1 may include or be one or more dual or multiple-transistors provided with a plurality of transistors including a first-first transistor T1_1 (hereinafter, referred to as a "first driving transistor") and a first-second transistor T1_2 (hereinafter, referred to as a "second driving transistor"), which are connected in series with each other between the first power source ELVDD and the light-emitting element EL. Gate electrodes of the plurality of transistors included in (e.g., constituting) the first transistor T1 (e.g., the first driving transistor T1_1 and the second driving transistor T1_2) may be connected to the same node (e.g., N1). For example, the gate electrodes of the first driving transistor T1_1 and the second driving transistor T1_2 may be commonly connected to the first node N1. Accordingly, the first driving transistor T1_1 and the second driving transistor T1_2 may be turned on or turned off concurrently (e.g., at the same or substantially the same time) in response to the voltage of the first node N1.

As described above, when the first transistor T1 is formed to include the plurality of transistors that are connected in series with each other, a driving range (e.g., a voltage range for expressing a plurality of gray levels) of the first transistor T1 may be suitably secured (e.g., sufficiently secured), and an area occupied by the first transistor T1 may be reduced. For example, in a structure in which the first transistor T1 includes the two transistors that are connected in series (e.g., the first and second driving transistors T1_1 and T1_2), a sum of channel lengths of the first and second driving transistors T1 and T1_2 that is used to secure a desired (e.g., a particular or a certain) driving range may have a value that is less (e.g., considerably smaller) than that of a channel length of a single transistor that is used to secure a driving range in a structure that includes a single transistor having a channel with the same or substantially the same width as that of the first transistor T1 (e.g., the sum of those of the first and second driving transistors T1_1 and T1_2).

In other words, when the first transistor T1 includes the plurality of transistors including at least the first and second driving transistors T1_1 and T1_2, the area occupied by the first transistor T1 at (e.g., in or on) each pixel region may be reduced, and the driving range of the first transistor T1 may be sufficiently secured. Accordingly, an image quality of the display device 1 may be improved while a limited pixel region may be efficiently utilized. One or more exemplary embodiments of the present invention may be usefully applied to display devices having various types and/or structures, including high resolution display devices, for example.

In an exemplary embodiment, the first driving transistor T1_1 and the second driving transistor T1_2 may have the same or substantially the same channel length (e.g., length of a channel region) as each other in the exemplary embodiment shown in FIG. 2. However, the present invention is not limited thereto, and in another exemplary embodiment, the first driving transistor T1_1 and the second driving transistor T1_2 may have different channel lengths from each other as in the exemplary embodiment shown in FIG. 3. For example, a channel region of the first driving transistor T1_1, which may determine the driving range of the first transistor T1, may be greater (e.g., longer) than a channel region of the second driving transistor T1_2. Accordingly, the driving range of the first transistor T1 may be sufficiently secured. In this case, the second driving transistor T1_2 may be formed as a short-channel transistor having a relatively shorter channel region than that of the first driving transistor T1_1, thereby securing element characteristics (e.g., reliability) of the first transistor T1.

According to one or more exemplary embodiments, the second to seventh transistors T2 to T7 may be operated as switching transistors of the pixel PXL, and may be formed as short-channel transistors. In an exemplary embodiment, each of the second to seventh transistors T2 to T7 may have a shorter channel length when compared to that of the first transistor T1. As described above, when each of the switching transistors is formed as a short-channel transistor, an operational speed (e.g., a switching speed) of the switching transistors may be improved while a limited pixel region is efficiently utilized.

The second transistor T2 is connected between the data line Dj and the first electrode of the first transistor T1. A gate electrode of the second transistor T2 is connected to the scan line Si.

When a scan signal having a gate-on voltage (e.g., a low level voltage) is supplied to the scan line Si, the second transistor T2 is turned on to connect the data line Dj and the first electrode of the first transistor T1 to each other. Therefore, when the second transistor T2 is turned on, a data signal from the data line Dj is transmitted to the first electrode of the first transistor T1. During a period in which the second transistor T2 is turned on by the scan signal, the third transistor T3 is also turned on by the scan signal, and the first transistor T1 is turned on in the form of a diode connection by the third transistor T3. In other words, the first transistor T1 is diode-connected when the third transistor T3 is turned on. Accordingly, the data signal from the data line Dj may be transmitted to the first node N1 through the second transistor T2, the first transistor T1, and the third transistor T3. Then, the storage capacitor Cst is charged with a voltage corresponding to the data signal and a threshold voltage of the first transistor T1.

The third transistor T3 is connected between the second electrode of the first transistor T1 and the first node N1. A gate electrode of the third transistor T3 is connected to the scan line Si. When a scan signal having a gate-on voltage is supplied to the scan line Si, the third transistor T3 is turned on to connect the second electrode of the first transistor T1 and the first node N1. Therefore, when the third transistor T3 is turned on, the first transistor T1 is connected in the form of a diode (e.g., diode-connected).

In an exemplary embodiment, in order to reduce a leakage current, the third transistor T3 may include a plurality of transistors that are connected in series with each other. For example, the third transistor T3 may include a third-first transistor T3_1 and a third-second transistor T3_2 that are connected in series between the first node N1 and the second electrode of the first transistor T1. Gate electrodes of the third-first transistor T3_1 and the third-second transistor T3_2 may be commonly connected to the scan line Si. Accordingly, the third-first transistor T3_1 and the third-second transistor T3_2 may be turned on or turned off concurrently (e.g., at the same or substantially the same time) in response to a scan signal.

The fourth transistor T4 is connected between the first node N1 and the initialization power source Vint. A gate electrode of the fourth transistor T4 is connected to the first control line CL1$i$. According to one or more exemplary embodiments, the first control line CL1$i$ may be an initialization control line for initializing the pixels PXL of the $i^{th}$ horizontal line, and may receive an initialization control signal having a gate-on voltage during an initialization period before a scan signal having a gate-on voltage is supplied to each scan line Si.

In an exemplary embodiment, the first control line CL1$i$ may be any one scan line from among previous scan lines for selecting the pixels PXL of previous horizontal lines, for example, an $(i-1)^{th}$ scan line Si-1 for selecting the pixels PXL of a previous (e.g., an immediately previous or an adjacent previous) horizontal line. In this case, the initialization control signal supplied to the first control line CL1$i$ may be an $(i-1)^{th}$ scan signal supplied to the $(i-1)^{th}$ scan line Si-1. However, the present invention is not limited thereto, and in another exemplary embodiment, the first control line CL1$i$ may be a control line that is formed separately from the scan lines S1 to Sn of the pixels PXL.

When a first control signal having a gate-on voltage is supplied to the first control line CL1$i$, the fourth transistor T4 is turned on. When the fourth transistor T4 is turned on, the voltage of the initialization power source Vint is transmitted to the first node N1, and thus, the voltage of the first node N1 is initialized based on the voltage of the initialization power source Vint.

According to one or more exemplary embodiments, the voltage of the initialization power source Vint may have (e.g., be set to) a voltage that is less than or equal to a voltage of a data signal. For example, the voltage of the initialization power source Vint may have (e.g., be set to) a voltage (e.g., a voltage level) that is less than or equal to a lowest voltage (e.g., a lowest voltage level) of the data signal. When the voltage of the first node N1 is initialized based on the voltage of the initialization power source Vint before a data signal of a current frame is supplied to each pixel PXL, the first transistor T1 is diode-connected in a forward direction during a scan period of each horizontal line (e.g., a period in which the scan signal is supplied to each scan line Si) irrespective of a data signal of a previous frame. Accordingly, irrespective of the data signal of the previous frame, the data signal of the current frame may be stably transmitted to the first node N1.

In an exemplary embodiment, in order to reduce a leakage current, the fourth transistor T4 may include a plurality of transistors that are connected in series with each other. For example, the fourth transistor T4 may include a fourth-first transistor T4_1 and a fourth-second transistor T4_2 that are connected in series between the first node N1 and the initialization power source Vint. Gate electrodes of the fourth-first transistor T4_1 and the fourth-second transistor T4_2 may be commonly connected to the first control line CL1$i$. Accordingly, the fourth-first transistor T4_1 and the fourth-second transistor T4_2 may be turned on or turned off concurrently (e.g., at the same or substantially the same time) in response to the first control signal (e.g., a previous scan signal).

When each of the third transistor T3 and the fourth transistor T4 are provided as multiple-transistors having at least a dual structure, a leakage current of each of the third transistor T3 and the fourth transistor T4 may be reduced or prevented. Accordingly, the leakage current through the third transistor T3 and the fourth transistor T4 may be reduced or prevented when in an off-state during an emission period of each frame, thereby stably maintaining or substantially maintaining the voltage of the first node N1. Accordingly, an expression of a gray level of the pixel PXL may be increased, and image quality of the display device 1 may be improved.

FIGS. 2 and 3 illustrate various exemplary embodiments in which each of the third and fourth transistors T3 and T4 is provided as a transistor having a dual structure, but the present invention is not limited thereto. For example, in another exemplary embodiment, only one transistor (e.g., the third transistor T3) from among the third transistor T3 and the fourth transistor T4 may be formed as a multiple-transistor (e.g., a dual transistor), and the other transistor (e.g., the fourth transistor T4) from among the third transistor T3 and the fourth transistor T4 may be formed as a single transistor. In still another exemplary embodiment, a switching transistor other than the third transistor T3 and the fourth transistor T4 (e.g., such as the second transistor T2 or at least one transistor from among the second transistor T2 and the fifth to seventh transistors T5 to T7) may also be formed as a multiple-transistor including a plurality of transistors that are connected in series with each other.

The fifth transistor T5 is connected between the first power source ELVDD and the first transistor T1. A gate electrode of the fifth transistor T5 is connected to the emission control line Ei. The fifth transistor T5 is turned off when an emission control signal having a gate-off voltage (e.g., a high level voltage) is supplied to the emission control line Ei, and the fifth transistor T5 is turned on otherwise.

The sixth transistor T6 is connected between the first transistor T1 and the light-emitting element EL. A gate electrode of the sixth transistor T6 is connected to the emission control line Ei. The sixth transistor T6 is turned off when an emission control signal having the gate-off voltage is supplied to the emission control line Ei, and the sixth transistor T6 is turned on otherwise.

That is, the fifth and sixth transistors T5 and T6 may be turned on or turned off concurrently (e.g., at the same or substantially the same time) in response to the emission control signal to control an emission period of each of the pixels PXL. When the fifth and sixth transistors T5 and T6 are turned on, a current path through which a driving current flows is formed in the pixel PXL. Accordingly, the pixel PXL may emit light having a luminance corresponding to the voltage of the first node N1. On the other hand, when the fifth and sixth transistors T5 and T6 are turned off, the current path is blocked (e.g., disconnected), and thus, the pixel PXL does not emit light.

According to one or more exemplary embodiments, an emission control signal may be supplied as a signal having a gate-off voltage to turn off the fifth and sixth transistors T5 and T6 during an initialization period and a data programming period (e.g., a scan period) of the pixel PXL. For example, during a period in which each of a scan signal, a first control signal, and a second control signal has a gate-on voltage, an emission control signal having a gate-off voltage may be supplied to overlap with the scan signal, the first control signal, and the second control signal. After a voltage of each of the scan signal, the first control signal, and the second control signal is changed to a gate-off voltage, a voltage of the emission control signal may be changed to a gate-on voltage, and thus, an emission period of a frame (e.g., each frame) may start. When the emission period of the pixel PXL is controlled using the emission control signal, a data signal may be stored (e.g., stably stored) in the pixel PXL, and then, the pixel PXL may emit light having a luminance corresponding to the data signal.

The seventh transistor T7 is connected between the initialization power source Vint and one electrode (for example, the anode electrode) of the light-emitting element EL. A gate electrode of the seventh transistor T7 is connected to the second control line CL2i. According to one or more exemplary embodiments, the second control line CL2i may be a bypass control line for initializing a voltage charged in an organic capacitor (e.g., a parasitic capacitor formed due to the structure of the light-emitting element EL) formed at (e.g., in or on) the light-emitting element EL of each of the pixels positioned at (e.g., in or on) the $i^{th}$ horizontal line. The second control line CL2i may receive a bypass control signal having a gate-on voltage before each emission period.

In an exemplary embodiment, the second control line CL2i may be any suitable scan line from among subsequent scan lines for selecting the pixels PXL of subsequent horizontal lines. For example, the second control line CL2i may be an $(i+1)^{th}$ scan line Si+1 for selecting the pixels PXL of an $(i+1)^{th}$ horizontal line, but the present invention is not limited thereto. For example, in another exemplary embodiment, the second control line CL2i may be a current scan line (e.g., the scan line Si) of each corresponding pixel PXL, or may be a control line that is formed separately from the scan lines S1 to Sn of the pixels PXL.

Before an emission period of each frame, when a second control signal having a gate-on voltage is supplied to the second control line CL2i, the seventh transistor T7 is turned on. When the seventh transistor T7 is turned on, the voltage of the initialization power source Vint is transmitted to the one electrode of the light-emitting element EL. Accordingly, because electric charges that are charged in the parasitic capacitor formed in the light-emitting element EL are initialized (e.g., uniformly initialized), the pixel PXL may exhibit more uniform luminance characteristics in response to each data signal during an emission period of each frame.

The storage capacitor Cst is connected to the first power source ELVDD and the first node N1. For example, one electrode of the storage capacitor Cst may be connected to the first power source ELVDD, and another electrode of the storage capacitor Cst may be connected to the first node N1. The above-described storage capacitor Cst may be charged with a voltage (e.g., having a desired voltage level) corresponding to a data signal and a threshold voltage of the first transistor T1.

According to one or more of the above-described exemplary embodiments of the pixel PXL and the display device 1 including the same, the first transistor T1 (e.g., operated as a driving transistor) of the pixel PXL is formed as the multiple-transistor including the first and second driving transistors T1_1 and T1_2. Accordingly, the driving range of the first transistor T1 may be sufficiently secured, and the area occupied by the first transistor T1 may be reduced.

In addition, according to one or more of the above-described exemplary embodiments of the pixel PXL and the display device 1 including the same, element characteristics of the first and second driving transistors T1_1 and T1_2 may be individually controlled. Accordingly, driving characteristics of the first transistor T1 may be improved or optimized.

For example, the first driving transistor T1_1 and the second driving transistor T1_2 may have cross-sectional structures that are asymmetric with each other. For example, at least one from among a thickness of a channel region and a thickness of an insulating film may be formed differently according to element characteristics to be secured for each of the first driving transistor T1_1 and the second driving transistor T1_2, and thus, the first driving transistor T1_1 and the second driving transistor T1_2 may have cross-sectional structures that are asymmetric with each other.

Figure 4:
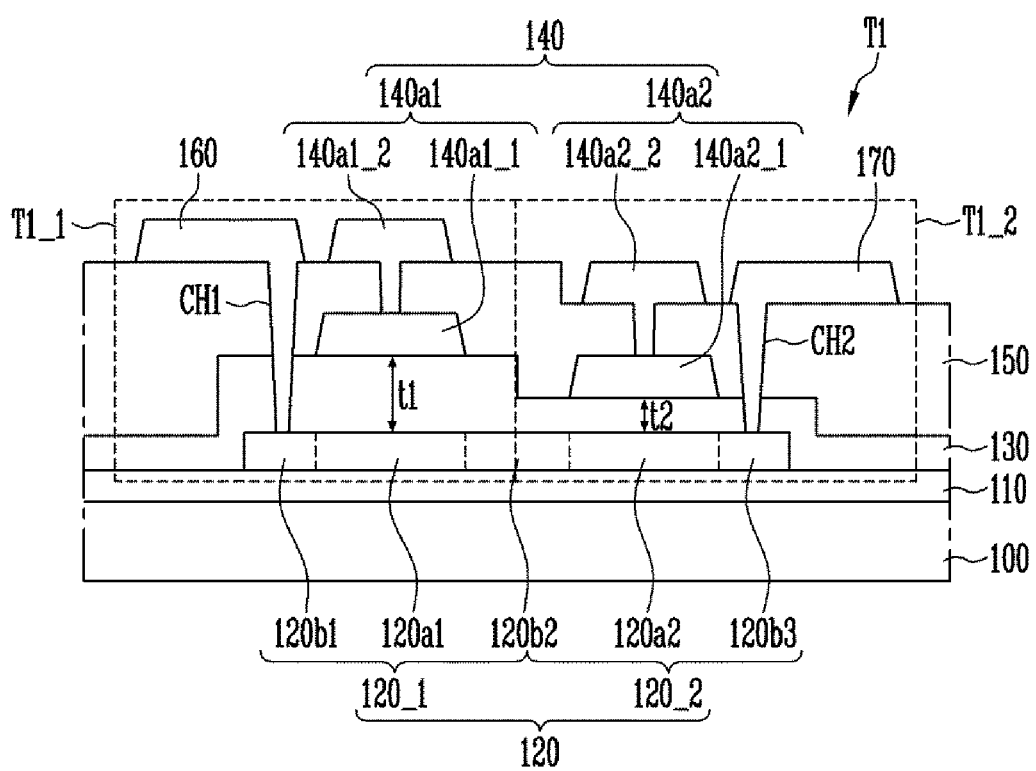
FIGS. 4 and 5 illustrate cross-sectional views of structures of a first transistor according to various exemplary embodiments of the present invention.
Figure 5:
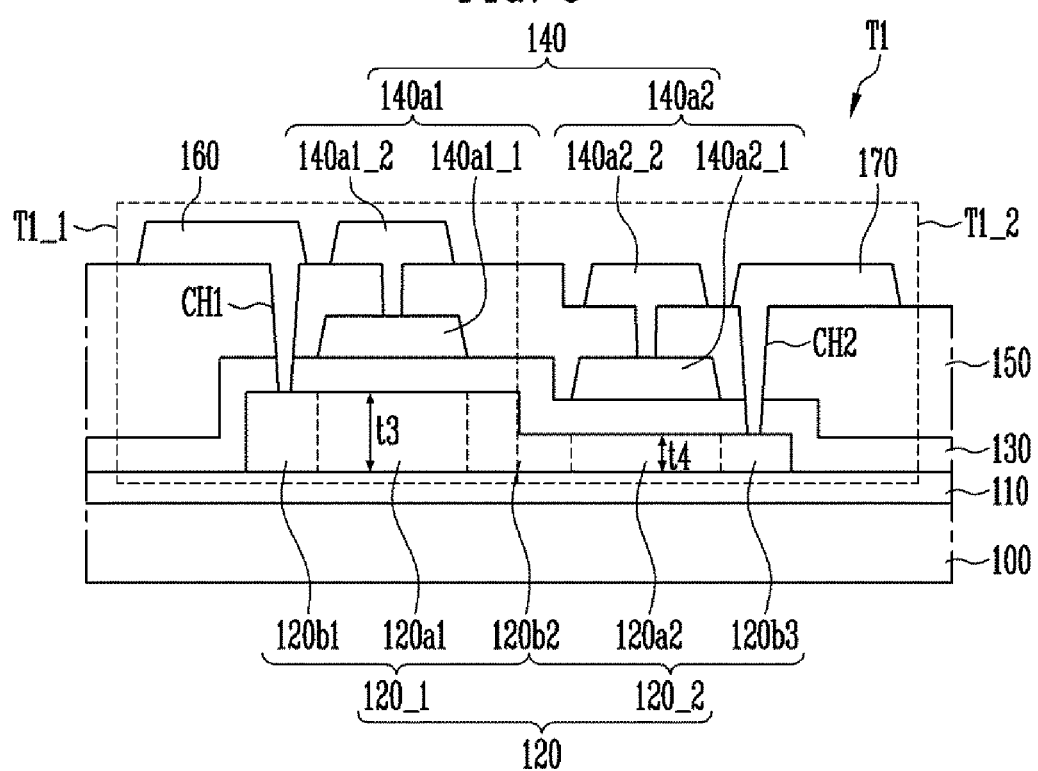

FIGS. 4 and 5 illustrate cross-sectional views of structures of the first transistor T1 according to various exemplary embodiments of the present invention. For example, FIGS. 4 and 5 illustrate different exemplary embodiments from each other of the cross-sectional views of the structure of the first transistor T1 that may be provided in the pixels PXL of FIGS. 2 and 3. However, the present invention is not limited thereto, and the structures of the first transistor T1 according to the exemplary embodiments of FIGS. 4 and 5 are not limited to being applied only to the pixels PXL shown in the exemplary embodiments of FIGS. 2 and 3. For example, in pixels PXL having various structures, each driving transistor may be formed to have any suitable one of the structures of the first transistor T1 according to the exemplary embodiments of FIGS. 4 and/or 5.

Referring to FIG. 4, the first transistor T1 according to an exemplary embodiment of the present invention may include an active layer pattern 120, a gate electrode 140, a first electrode 160, and a second electrode 170. The active layer pattern 120 may be disposed on (or above) a surface (e.g., one surface) of a base layer 100 on which a buffer layer 110 is formed. The gate electrode 140 may be disposed on a first insulating film 130, and may overlap with a region (e.g., one region) of the active layer pattern 120. The first electrode 160 and the second electrode 170 may be spaced apart from the active layer pattern 120 with each of the first insulating film 130 and a second insulating film 150 interposed therebetween. The first electrode 160 and the second electrode 170 may be connected to different regions of the active layer pattern 120.

According to one or more exemplary embodiments, the first transistor T1 may include a first driving transistor T1_1 and a second driving transistor T1_2 that are connected in series with each other. For example, the first driving transistor T1_1 and the second driving transistor T1_2 may be the same or substantially the same as the first driving transistor T1_1 and the second driving transistor T1_2 shown in FIG. 2 or in FIG. 3. For example, the first driving transistor T1_1 may be connected between the first power source ELVDD and the second driving transistor T1_2, and the second driving transistor T1_2 may be connected between the first driving transistor T1_1 and the light-emitting element EL.

In this case, the first transistor T1 may include a plurality of channel regions. For example, the first transistor T1 may include a first channel region 120a1 that forms a channel of the first driving transistor T1_1, and a second channel region 120a2 that forms a channel of the second driving transistor T1_2. In an exemplary embodiment, the first channel region 120a1 and the second channel region 120a2 may have the same or substantially the same length. In another exemplary embodiment, the first channel region 120a1 and the second channel region 120a2 may have different lengths. For example, the length of the first channel region 120a1 may be greater than the length of the second channel region 120a2. A conductive region may be disposed at each side (e.g., both sides) of each of the first channel region 120a1 and the second channel region 120a2.

For example, a first conductive region 120b1 and a second conductive region 120b2 may be disposed at sides (e.g., both sides) of the first channel region 120a1. The first and second conductive regions 120b1 and 120b2 together with the first channel region 120a1 may define (e.g., form or constitute) an active layer pattern 120_1 (hereinafter, referred to as a "first active layer pattern") of the first driving transistor T1_1. In other words, the first driving transistor T1_1 may include the first active layer pattern 120_1 including the first channel region 120a1, the first conductive region 120b1, and the second conductive region 120b2.

One of the first conductive region 120b1 and the second conductive region 120b2 may be a source region of the first driving transistor T1_1, and another one of the first conductive region 120b1 and the second conductive region 120b2 may be a drain region of the first driving transistor T1_1. For example, when the first conductive region 120b1 is the source region of the first driving transistor T1_1, the second conductive region 120b2 may be the drain region of the first driving transistor T1_1. On the other hand, when the first conductive region 120b1 is the drain region of the first driving transistor T1_1, the second conductive region 120b2 may be the source region of the first driving transistor T1_1. However the present invention is not limited thereto, and the first and second conductive regions 120b1 and 120b2 may be variously modified according to (e.g., depending on) a carrier type (e.g., an n-type or p-type) and a current direction of the first driving transistor T1_1.

The second channel region 120a2 may be spaced apart from the first channel region 120a1 with at least one conductive region interposed therebetween. For example, the second channel region 120a2 may be spaced apart from the first channel region 120a1 with the second conductive region 120b2 interposed therebetween.

The second conductive region 120b2 and a third conductive region 120b3 may be disposed at sides (e.g., both sides) of the second channel region 120a2. For example, the third conductive region 120b3 may be spaced apart from the second conductive region 120b2 with the second channel region 120a2 interposed therebetween. The second and third conductive regions 120b2 and 120b3 together with the second channel region 120a2 may define (e.g., form or constitute) an active layer pattern 120_2 (hereinafter, referred to as a "second active layer pattern") of the second driving transistor T1_2. In other words, the second driving transistor T1_2 may include the second active layer pattern 120_2 including the second channel region 120a2, the second conductive region 120b2, and the third conductive region 120b3.

One of the second conductive region 120b2 and the third conductive region 120b3 may be a source region of the second driving transistor T1_2, and another one of the second conductive region 120b2 and the third conductive region 120b3 may be a drain region of the second driving transistor T1_2. For example, when the second conductive region 120b2 is the source region of the second driving transistor T1_2, the third conductive region 120b3 may be the drain region of the second driving transistor T1_2. On the other hand, when the second conductive region 120b2 is the drain region of the second driving transistor T1_2, the third conductive region 120b3 may be the source region of the second driving transistor T1_2. However the present invention is not limited thereto, and the second and third conductive regions 120b2 and 120b3 may be variously modified according to (e.g., depending on) a carrier type (e.g., an n-type or p-type) and a current direction of the second driving transistor T1_2.

In an exemplary embodiment, the first driving transistor T1_1 and the second driving transistor T1_2 may share one conductive region. For example, the first driving transistor T1_1 and the second driving transistor T1_2 may share the second conductive region 120b2. In other words, in some embodiments, the first driving transistor T1_1 and the second driving transistor T1_2 may have a common conductive region, for example, the second conductive region 120b2.

In this case, the second conductive region 120b2 may define (e.g., form or constitute) a common electrode between the first driving transistor T1_1 and the second driving transistor T1_2. For example, the second conductive region 120b2 may be a drain electrode of the first driving transistor T1_1 and a source electrode of the second driving transistor T1_2. The first driving transistor T1_1 and the second driving transistor T1_2 may be connected to each other through the second conductive region 120b2.

According to one or more exemplary embodiments, the first active layer pattern 120_1 and the second active layer pattern 120_2 may be connected (e.g., integrally connected) to each other. For example, the first active layer pattern 120_1 and the second active layer pattern 120_2 may be integrally connected to each other through the second conductive region 120b2.

However, the present invention is not limited thereto. For example, in another exemplary embodiment, the conductive regions of the first driving transistor T1_1 and the second driving transistor T1_2 may be formed in patterns that are separated from each other. In this case, any suitable one conductive region of the first driving transistor T1_1 and any suitable one conductive region of the second driving transistor T1_2 (e.g., the drain region of the first driving transistor T1_1 and the source region of the second driving transistor T1_2) may be electrically connected to each other (e.g., directly connected to each other or connected to each other through an intermediate component such as a VIA or contact).

When the first transistor T1 is a multiple-transistor (e.g., a dual transistor), the first transistor T1 may include a multiple-gate electrode 140 (e.g., a dual gate electrode). For example, the first transistor T1 may include a first gate electrode 140a1 that overlaps with the first channel region 120a1 with the first insulating film 130 interposed therebetween, and a second gate electrode 140a2 that overlaps with the second channel region 120a2 with the first insulating film 130 interposed therebetween. Similarly, when the first transistor T1 is a multi-structure transistor that includes three or more transistors, the first transistor T1 may have three or more channel regions and three or more gate electrodes that overlap with the channel regions.

In an exemplary embodiment, the gate electrode 140 may include multiple layers. For example, the first gate electrode 140a1 may include multiple layers including a lower electrode 140a1_1 that is disposed between the first insulating film 130 and the second insulating film 150, and an upper electrode 140a1_2 that is connected to the lower electrode 140a1_1 and disposed on the second insulating film 150. Similarly, the second gate electrode 140a2 may include multiple layers including a lower electrode 140a2_1 that is disposed between the first insulating film 130 and the second insulating film 150, and an upper electrode 140a2_2 that is connected to the lower electrode 140a2_1 and disposed on the second insulating film 150. When the gate electrode 140 includes multiple layers, resistance of the gate electrode 140 and a gate node connected to the gate electrode (e.g., the first node N1) may be lowered.

However, the present invention is not limited thereto. For example, in another exemplary embodiment, one of the first gate electrode 140a1 and the second gate electrode 140a2 may include multiple layers, and the other of the first gate electrode 140a1 and the second gate electrode 140a2 may include a single layer. In still another exemplary embodiment, each of the first gate electrode 140a1 and the second gate electrode 140a2 may include a single layer, and the first gate electrode 140a1 and the second gate electrode 140a2 may be disposed at (e.g., in or on) the same layer or different layers from each other. For example, each of the first gate electrode 140a1 and the second gate electrode 140a2 may include only the lower electrode 140a1_1 and/or 140a2_1 that are positioned between the first insulating film 130 and the second insulating film 150.

The first gate electrode 140a1 and the second gate electrode 140a2 are electrically connected to each other. For example, the first gate electrode 140a1 and the second gate electrode 140a2 may be commonly connected to the first node N1, as shown in the exemplary embodiments of FIGS. 2 and 3.

The first electrode 160 and the second electrode 170 may be disposed on the second insulating film 150, and may be connected to different regions of the active layer pattern 120. For example, the first electrode 160 may be connected to the first conductive region 120b1 through a first contact hole CH1 that extends (or passes) through the first and second insulating films 130 and 150. The second electrode 170 may be connected to the third conductive region 120b3 through a second contact hole CH2 that extends (or passes) through the first and second insulating films 130 and 150. According to one or more exemplary embodiments, the first electrode 160 may be one electrode from among a source electrode and a drain electrode of the first transistor T1, and the second electrode 170 may be another electrode from among the source electrode and the drain electrode of the first transistor T1. For example, when the first electrode 160 is the source electrode of the first transistor T1 (e.g., or the first driving transistor T1_1), the second electrode 170 may be the drain electrode of the first transistor T1 (e.g., or the second driving transistor T1_2). On the other hand, when the first electrode 160 is the drain electrode of the first transistor T1 (e.g., or the first driving transistor T1_1), the second electrode 170 may be the source electrode of the first transistor T1 (e.g., or the second driving transistor T1_2).

However, the present invention is not limited thereto, and the position of the first electrode 160 and the second electrode 170 is not particularly limited, and may be variously modified according to other exemplary embodiments. In addition, according to one or more exemplary embodiments, at least one electrode from among the first electrode 160 and the second electrode 170 may be omitted.

For example, when the first transistor T1 is connected to (e.g., directly to) another circuit element (e.g., at least one transistor and/or capacitor) through the first conductive region 120b1, the first electrode 160 may be omitted. In this case, the first conductive region 120b1 may be the source electrode or the drain electrode of the first transistor T1. Similarly, when the first transistor T1 is connected to (e.g., directly connected to) another circuit element through the third conductive region 120b3, the second electrode 170 may be omitted. In this case, the third conductive region 120b3 may be the source electrode or the drain electrode of the first transistor T1. In other embodiments, in some respects, the first and/or third conductive regions 120b1 and 120b3 may be considered to be the source and/or drain electrodes of the first transistor T1, and the first and/or second electrodes 160 and 170 may be considered to be wires that are connected to corresponding electrodes of the first transistor T1 or corresponding electrodes of another circuit element.

According to the exemplary embodiment of FIG. 4, a thickness of a gate insulating film of the first transistor T1 may be modified for each region. For example, the first insulating film 130 provided between the active layer pattern 120 and the gate electrode 140 of the first transistor T1 may define (e.g., form or constitute) a gate insulating film (e.g., a first gate insulating film) of the first transistor T1, and may have different thicknesses at (e.g., in or on) a region in which the first driving transistor T1_1 is formed and at a region in which the second driving transistor T1_2 is formed.

For example, the first insulating film 130 may have a first thickness (e.g., a relatively large first thickness) t1 at (e.g., in or on) at least one region corresponding to the region at (e.g., in or on) which the first driving transistor T1_1 is formed. For example, the first thickness t1 of the first insulating film 130 at the region between the first channel region 120a1 and the first gate electrode 140a1 may be relatively larger when compared with the thicknesses of the first insulating film 130 at other regions. In addition, the first insulating film 130 may have a second thickness t2 that is smaller than the first thickness t1 at (e.g., in or on) at least one region corresponding to the region at (e.g., in or on) which the second driving transistor T1_2 is formed. For example, the first insulating film 130 at the region between the second channel region 120a2 and the second gate electrode 140a2 may have the second thickness t2. In other words, the first insulating film 130 may have an increased thickness (e.g., a locally increased thickness) at (e.g., in or on) the region in which the first driving transistor T1_1 is formed.

When the thickness of the first insulating film 130 is increased at (e.g., in or on) the region in which the first driving transistor T1_1 is formed, sensitivity of the first driving transistor T1_1 may be lowered. Accordingly, as a degree of change in a drain current Ids (also referred to as a "source current") according to a change in a gate-to-source voltage Vgs of the first driving transistor T1_1 is reduced, a driving range of the first transistor T1 corresponding to an operation voltage range between a lowest gray voltage and a highest gray voltage is extended (e.g., increased).

Referring to FIG. 5, an active layer pattern 120 of the first transistor T1 according to another exemplary embodiment of the present invention may have a different thickness depending on a region (e.g., for each region). For example, the active layer pattern 120 may have different thicknesses at (e.g., in or on) a region in which a first driving transistor T1_1 is formed and at a region in which a second driving transistor T1_2 is formed.

For example, the active layer pattern 120 may have an increased (e.g., a locally increased) third thickness t3 at (e.g., in or on) a region defining (e.g., forming or constituting) an active layer pattern (e.g., a first active layer pattern 120_1) of the first driving transistor T1_1, for example, at (e.g., in or on) at least a first channel region 120a1. In addition, the active layer pattern 120 may have a fourth thickness t4 that is smaller than the third thickness t3 at (e.g., in or on) a region defining (e.g., forming or constituting) an active layer pattern (e.g., a second active layer pattern 120_2) of the second driving transistor T1_2. In addition, according to one or more exemplary embodiments, active layer patterns of the other remaining transistors of the pixel PXL, for example, the switching transistors, may have the same or substantially the same thickness (e.g., the fourth thickness t4) as that of the second active layer pattern 120_2. In other words, the first driving transistor T1_1 may include the first channel region 120a1 having a relatively larger thickness when compared with those of other transistors of the pixel PXL.

When the thickness of the first channel region 120a1 is increased, sensitivity of the first driving transistor T1_1 according to a change in a gate-to-source voltage Vgs is lowered. Accordingly, as an amount of change in a drain current Ids according to the change in the gate-to-source voltage Vgs of the first driving transistor T1_1 is reduced, the driving range of the first transistor T1 is extended (e.g., increased).

According to one or more exemplary embodiments of the present invention, each exemplary embodiment may be implemented singularly (e.g., alone), or at least two exemplary embodiments may be implemented in combination. For example, in an exemplary embodiment, only one from among a thickness of a gate insulating film and a thickness of a channel region of the first or second driving transistors T1_1 or T1_2 shown in the exemplary embodiments of FIGS. 4 and 5 may be formed differentially. On the other hand, in another exemplary embodiment, both of the thickness of the gate insulating film and the thickness of the channel region of the first and/or second driving transistor T1_1 and/or T1_2 may be formed differentially.

According to the exemplary embodiments of FIGS. 4 and 5, in the case of the first driving transistor T1_1, which determines the driving range of the first transistor T1, the thickness of the gate insulating film (e.g., the first insulating film 130) may be increased, or the thickness of the channel region (e.g., the first channel region 120a1) may be increased, thereby extending (e.g., increasing) the driving range of the first transistor T1. In the case of the second driving transistor T1_2, in order to strengthen a control force of the first transistor T1, and to reduce a distribution of element characteristics of the first transistor T1 according to a gate voltage, the gate insulating film and/or the channel region may be formed to have a smaller thickness when compared with that of the first driving transistor T1_1. For example, the second driving transistor T1_2 may be formed to react more sensitively to the gate-to-source voltage Vgs at a higher speed when compared to that of the first driving transistor T1_1, thereby suitably controlling (e.g., easily controlling) the first transistor T1.

In other words, in one or more of the above-described exemplary embodiments, the first transistor T1 includes a plurality of transistors including the first and second driving transistors T1_1 and T1_2, and element characteristics of each of the plurality of transistors may be individually adjusted. Accordingly, driving characteristics of the first transistor T1 may be improved or optimized.

Figure 6:
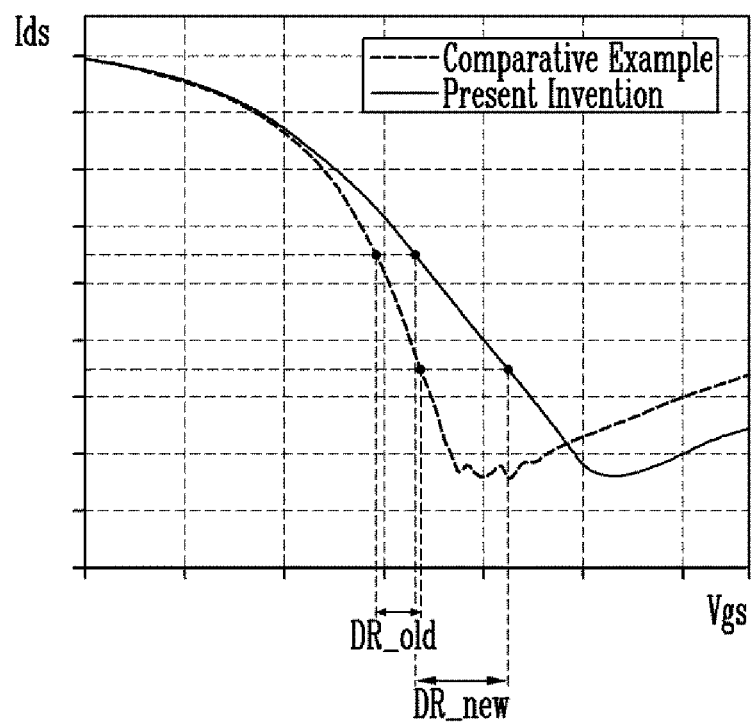
FIG. 6 illustrates a driving range of the first transistor according to an exemplary embodiment of the present invention.

FIG. 6 illustrates a driving range of the first transistor T1 according to an exemplary embodiment of the present invention. For example, FIG. 6 illustrates the driving range of the first transistor T1 according to the application of at least one of the exemplary embodiments of FIGS. 4 and 5.

Referring to FIGS. 4 to 6, the thickness of the first insulating film 130 and/or the thickness of the first active layer pattern 120_1 at (e.g., in or on) the region in which the first driving transistor T1_1 is formed may be increased, thereby reducing a degree of change in a drain current Ids according to the gate-to-source voltage Vgs of the first transistor T1. In other words, when sensitivity of the first driving transistor T1_1 according to the gate-to-source voltage Vgs is lowered according to one or more exemplary embodiments of the present invention, a gradient of the drain current Ids according to the gate-to-source voltage Vgs of the first transistor T1 may become gentler (e.g., smaller). According to one or more exemplary embodiments of the present invention, the driving range of the first transistor T1 may be extended (e.g., increased).

For example, in a Comparative Example, it is to be assumed that a single driving transistor is provided, and each of a gate insulating film and an active layer pattern of the single driving transistor has the same thickness (e.g., the second thickness t2 and the fourth thickness t4) as those of a gate insulating film and an active layer pattern of each of the remaining transistors. In this case, when a gate-to-source voltage Vgs is changed, a drain current Ids of a first transistor T1 according to the Comparative Example is more abruptly changed as compared with that of the first transistor T1 according to the one or more exemplary embodiments of the present invention. On the other hand, in the first transistor T1 according to one or more exemplary embodiments of the present invention, a change in the drain current Ids according to the gate-to-source voltage Vgs is relatively small. Therefore, according to one or more exemplary embodiments of the present invention, it may be possible to extend (e.g., increase) an operation voltage range of the first driving transistor T1 corresponding to the drain current Ids in a specific range, for example, a driving range of the first driving transistor T1. For example, assuming that the single driving transistor in the Comparative Example has an existing driving range DR_old with respect to the drain current Ids in a certain range, the first transistor T1 according to one or more exemplary embodiments of the present invention may have an improved driving range DR_new that is wider than the existing driving range DR_old of the single driving transistor in the Comparative Example.

Figure 7:
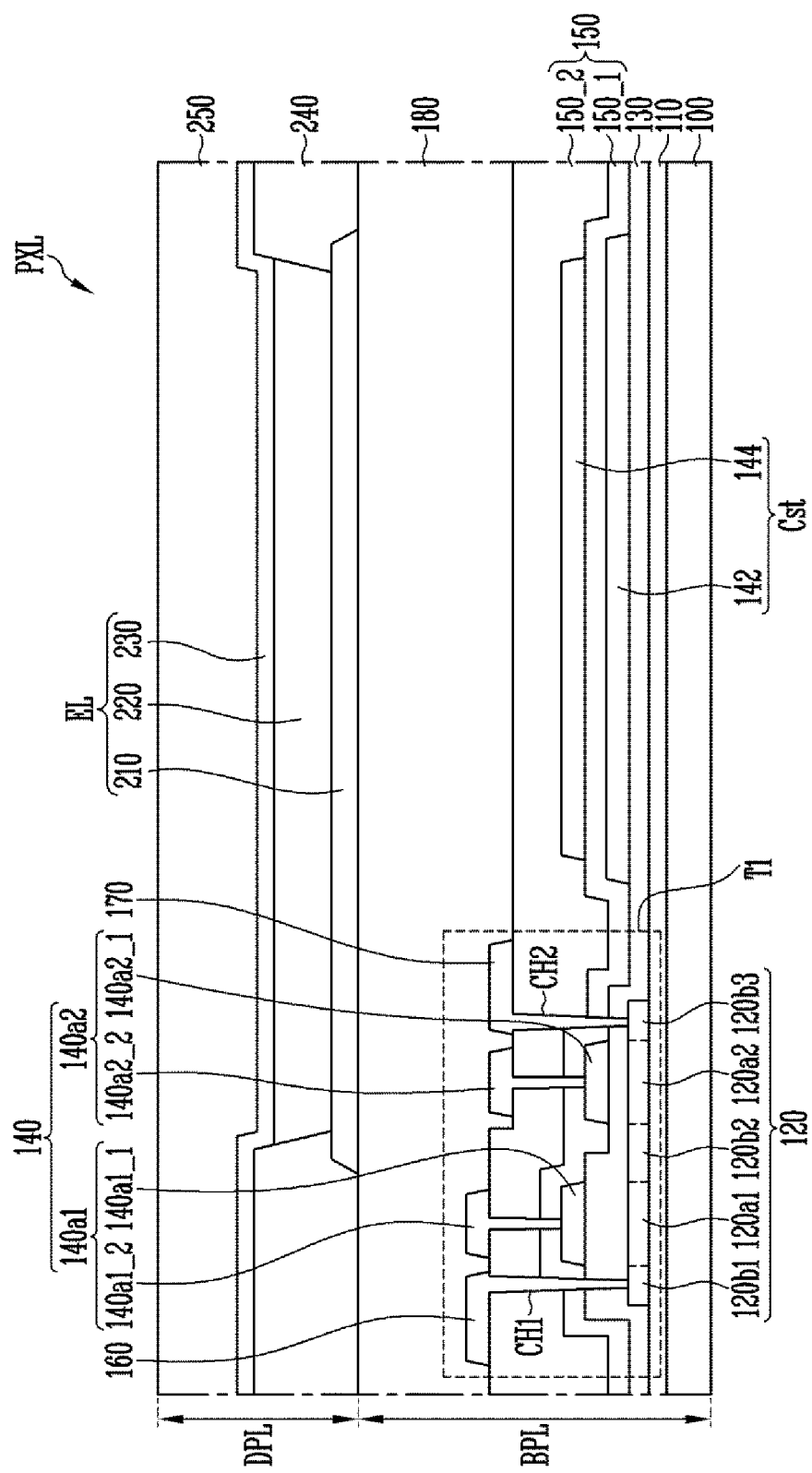
FIGS. 7 and 8 illustrate cross-sectional views of structures of a pixel including a first transistor according to various exemplary embodiments of the present invention.
Figure 8:
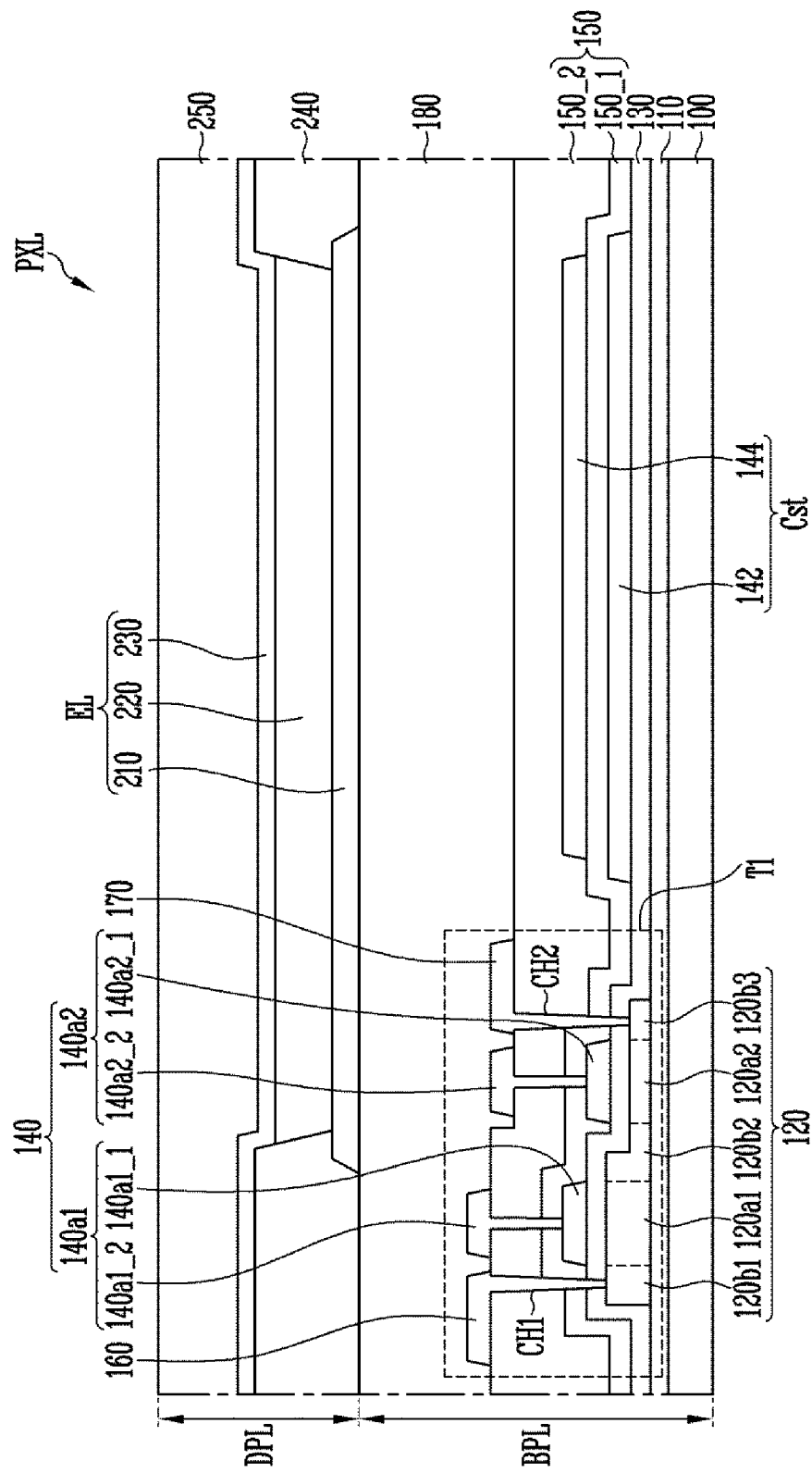

FIGS. 7 and 8 illustrate cross-sectional views of structures of the pixel PXL including the first transistor T1 according to various exemplary embodiments of the present invention. For example, FIGS. 7 and 8 illustrate cross sectional views of one region of each of the pixels PXL including the first transistors T1 according to the exemplary embodiments of FIGS. 4 and 5, respectively. In the exemplary embodiments of FIGS. 7 and 8, the same or similar (e.g., substantially the same) components (e.g., such as the first transistor T1) as those of the exemplary embodiments of FIGS. 4 and 5 are denoted by the same reference symbols, and thus, redundant descriptions thereof may not be repeated.

Referring to FIGS. 7 and 8, the pixel PXL includes various circuit elements including, for example, the first transistor T1, a storage capacitor Cst, and a light-emitting element EL. For example, the pixel PXL, and a display panel including the same, may include a backplane layer BPL (also referred to as a "circuit element layer" or "circuit layer") and a display element layer DPL on the backplane layer BPL. The backplane layer BPL may be a layer at (e.g., in or on) which circuit elements of the pixel (e.g., each pixel) PXL and wires connected thereto are disposed, and the display element layer DPL may be a layer at (e.g., in or on) which the light-emitting element EL of the pixel (e.g., each pixel) PXL is disposed.

According to one or more exemplary embodiments, the storage capacitor Cst may include a lower electrode 142 and an upper electrode 144, which are each disposed on the same or different layer from that of one electrode of the first transistor T1. For example, the lower electrode 142 of the storage capacitor Cst may be disposed on a first insulating film 130, which is at a same layer as those of (e.g., together with) lower electrodes 140a1_1 and 140a2_1 of first and second gate electrodes 140a1 and 140a2. The upper electrode 144 of the storage capacitor Cst may be disposed at (e.g., in or on) a different layer from those of the electrodes of the first transistor T1.

For example, a second insulating film 150 may have a multi-layered structure including a lower insulating film 150_1 and an upper insulating film 150_2. The upper electrode 144 of the storage capacitor Cst may be disposed between the lower insulating film 150_1 and the upper insulating film 150_2 of the second insulating film 150.

In an exemplary embodiment, upper electrodes 140a1_2 and 140a2_2 of the first and second gate electrodes 140a1 and 140a2 may be disposed on the second insulating film 150, which is at a same layer as those of (e.g., together with) the first and second electrodes 160 and 170, but the present invention is not limited thereto. For example, in another exemplary embodiment, the upper electrodes 140a1_2 and 140a2_2 of the first and second gate electrodes 140a1 and 140a2 may be disposed between the lower insulating film 150_1 and the upper insulating film 150_2 of the second insulating film 150, which is at a same layer as those of (e.g., together with) the upper electrode 144 of the storage capacitor Cst. In still another exemplary embodiment, the first and second gate electrodes 140a1 and 140a2 may be formed as single-layer electrodes including only the lower electrodes 140a1_1 and 140a2_1 formed on the first insulating film 130.

In other words, the structures and positions of various circuit elements, wires, insulating films, and/or the like that are formed at (e.g., in or on) the backplane layer BPL may be variously modified according to various exemplary embodiments. In some embodiments, a third insulating film 180 may be disposed on the circuit elements and the wires.

The third insulating film 180 may include a single layer or multiple layers. When the third insulating film 180 is provided to include the multiple layers, the layers may be made of the same or substantially the same material(s) or of different materials. For example, the third insulating film 180 may include multiple layers including a first passivation layer formed as at least one layer of an inorganic insulating film, and a second passivation layer formed as at least one layer of an organic insulating film. When the third insulating film 180 includes at least one layer of the organic insulating film, a surface of the backplane layer BPL may be planarized or substantially planarized.

The display element layer DPL may include the light-emitting element EL, and may further include a bank structure, for example, a pixel definition film (e.g., or a pixel defining layer) 240 for defining an emission region (e.g., an emission region of each pixel PXL) at (e.g., in or on) which the light-emitting element (e.g., each light-emitting element) EL is disposed. In addition, a protective layer 250 may be disposed on the light-emitting element EL and the pixel definition film 240.

The light-emitting element EL includes a first electrode 210, a light-emitting layer 220, and a second electrode 230, which are stacked (e.g., sequentially stacked) on the third insulating film 180. According to one or more exemplary embodiments, one of the first and second electrodes 210 and 230 of the light-emitting element EL may be an anode electrode, and the other of the first and second electrodes 210 and 230 may be a cathode electrode. For example, when the first electrode 210 is the anode electrode, the second electrode 230 may be the cathode electrode. On the other hand, when the first electrode 210 is the cathode electrode, the second electrode 230 may be the anode electrode.

The first electrode 210 of the light-emitting element EL may be disposed on the third insulating film 180, and may be connected to at least one circuit element defining (e.g., forming or constituting) the pixel circuit (e.g., each pixel circuit) PXC through a contact hole or the like. In an example, the first electrode 210 may be connected to one electrode from among the electrodes of the sixth and seventh transistors T6 and T7 through a contact hole or a via hole that extends (e.g., passes) through the third insulating film 180.

The pixel definition film 240 may be configured to partition an emission region of a corresponding pixel PXL, and may be formed in the pixel region (e.g., each pixel region) in which the first electrode 210 is formed. The pixel definition film 240 may be disposed between the emission regions of the pixels PXL, and may have an opening that exposes the first electrode 210 at (e.g., in or on) the emission region of the pixel (e.g., each pixel) PXL. For example, the pixel definition film 240 may extend upward from a surface (e.g., one surface) of the base layer 100 on which the first electrode 210 or the like is formed, and may extend along an outer periphery of the emission area of the pixel (e.g., each pixel) PXL.

The light-emitting layer 220 may be formed at (e.g., in) the emission region (e.g., each emission region) that is surrounded by the pixel definition film 240. For example, the light-emitting layer 220 may be disposed on an exposed surface of the first electrode 210. The light-emitting layer 220 may include at least one light generation layer, and may further include at least one common layer in addition to the light generation layer. For example, the light-emitting layer 220 may have a multi-layered thin film structure including the light generation layer.

In an exemplary embodiment, the light-emitting layer 220 may include the light generation layer that is configured to emit light with a suitable color (e.g., a predefined or certain color), a first common layer disposed between the light generation layer and the first electrode 210, and a second common layer disposed between the light generation layer and the second electrode 230. According to one or more exemplary embodiments, the first common layer may include at least one of a hole injection layer and a hole transport layer. According to one or more exemplary embodiments, the second common layer may include at least one of a hole blocking layer, an electron transport layer, and an electron injection layer. According to one or more exemplary embodiments, the light generation layer may be patterned (e.g., individually patterned) to correspond to each emission region. The first common layer and the second common layer may be formed (e.g., entirely formed) on the display region 10 at (e.g., in or on) which the pixels PXL are disposed.

The second electrode 230 of the light-emitting element EL may be formed on the light-emitting layer 220. According to one or more exemplary embodiments, the second electrode 230 may be formed (e.g., entirely formed) on the display region 10, but the present invention is not limited thereto.

The protective layer 250 may be formed on the light-emitting element EL to cover the second electrode 230 of the light-emitting element EL. According to one or more exemplary embodiments, the protective layer 250 may include an encapsulation layer or an encapsulation substrate to seal the pixels, which is disposed on one region (e.g., at least a display region 10) of the display panel on which the pixels PXL are disposed. For example, the protective layer 250 may include a thin film encapsulation layer (TFE). When the TFE is formed to seal the display region 10, a thickness of the display panel may be reduced, and flexibility may be secured while the pixels PXL are protected.

According to one or more exemplary embodiments, the protective layer 250 may have a single-layer structure or a multi-layered structure. For example, the protective layer 250 may include multiple films including at least two inorganic films that overlap with each other, and at least one organic film interposed between the inorganic films. However, the structure and/or materials of the protective layer 250 may be variously modified according to other exemplary embodiments.

The present invention is not limited thereto, for example, the structures of the pixel PXL and the display panel including the same are not limited to the exemplary embodiments shown in FIGS. 7 and 8, and may be variously modified according to the various features described with reference to each exemplary embodiment. For example, the pixel PXL and the display panel including the same may be formed to have various suitable structures as would be known to those having ordinary skill in the art.

FIGS. 9A to 9J illustrate a method of manufacturing the display device 1 according to an exemplary embodiment of the present invention. For example, FIGS. 9A to 9J sequentially illustrate operations of manufacturing the first transistor T1 from among operations of manufacturing the display device 1 according to the exemplary embodiment shown in FIG. 4, which includes the pixel PXL including the first transistor T1 (e.g., the first driving transistor T1_1 and the second driving transistor T1_2 that are connected in series with each other). In other words, in FIGS. 9A to 9J, the method of manufacturing the display device 1 will be described based on a method of manufacturing the first transistor T1 operated as a driving transistor of the pixel PXL. However, according to one or more exemplary embodiments, after a backplane layer BPL including the first transistor T1 is formed (e.g., using the process shown in FIGS. 9A to 9J), a process of forming the display element layer DPL according to the exemplary embodiment of FIG. 7 may be followed.

Figure 9A:
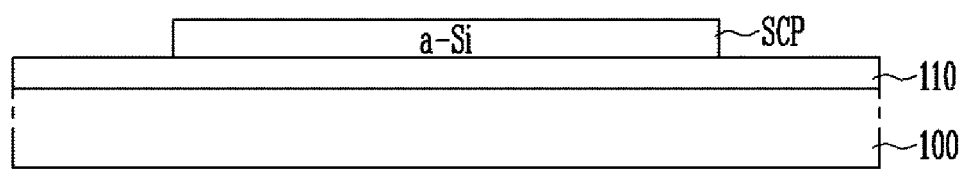

Referring to FIGS. 4 and 9A, after a buffer layer 110 is formed on the base layer 100, a semiconductor pattern SCP may be formed at (e.g., in or on) a transistor region (e.g., each transistor region) on the buffer layer 110. For example, the semiconductor pattern SCP may be formed at a driving transistor region in which the first transistor T1 is disposed. However, the present invention is not limited thereto, and according to other exemplary embodiments, the buffer layer 110 may be omitted. In this case, the semiconductor pattern SCP may be formed on (e.g., directly on) a surface (e.g., one surface) of the base layer 100.

The base layer 100 may be a base member for forming a panel of the display device 1. According to one or more exemplary embodiments, the base layer 100 may be a rigid substrate or film or a flexible substrate or film, and the material(s) and/or physical properties thereof are not particularly limited. For example, the base layer 100 may include (or may be) a rigid substrate made of glass or tempered glass, a flexible substrate (or a thin film) made of plastic or metal, and/or at least one layer of an insulating film, but the material(s) and/or physical properties thereof are not particularly limited. In addition, the base layer 100 may be transparent, but the present invention is not limited thereto. For example, the base layer 100 may include (or be made of) a transparent base member, a semi-transparent base member, an opaque base member, a reflective base member, and/or the like.

The buffer layer 110 may be formed (e.g., selectively formed) on a surface (e.g., one surface) of the base layer 100. The buffer layer 110 may prevent or substantially prevent impurities from diffusing into circuit elements that are formed (or to be formed) on the buffer layer 110. The buffer layer 110 may include a single layer or may include multiple layers (e.g., at least two layers). When the buffer layer 110 is provided in multiple layers, the layers may be made of the same or substantially same material(s) or may be made of different materials from each other. For example, the buffer layer 110 may be formed to include multiple layers including, for example, a silicon nitride layer ($SiN_x$) and/or a silicon oxide layer ($SiO_x$).

The semiconductor pattern SCP may be used for forming an active layer pattern of each transistor (e.g., the active layer pattern 120 of the first transistor T1). The semiconductor pattern SCP may be formed on one surface of the base layer 100 on which the buffer layer 110 is formed. For example, a semiconductor material may be deposited on the buffer layer 110 to form a semiconductor material layer, and then, the semiconductor material layer may be patterned to form the semiconductor pattern SCP (e.g., each semiconductor pattern SCP).

According to one or more exemplary embodiments, the semiconductor pattern SCP may be made of amorphous silicon (a-Si). For example, the buffer layer 110 and an amorphous silicon film may be formed (e.g., sequentially formed) on the base layer 100 through various suitable methods, such as a chemical vapor deposition (CVD) method, and then the amorphous silicon film may be patterned to form the semiconductor pattern (e.g., each semiconductor pattern) SCP to correspond to a region at (e.g., in or on) which a transistor (e.g., the first transistor T1 or each transistor) is to be formed.

Figure 9B:
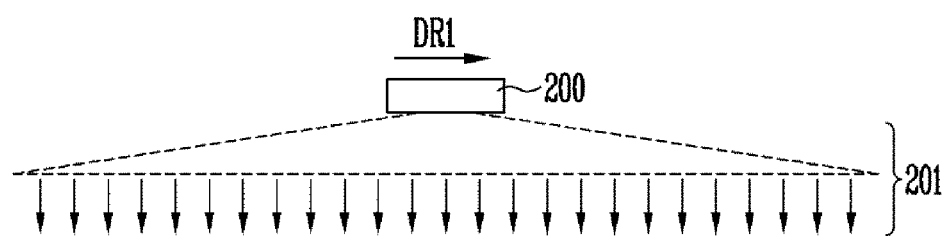
Figure 9C:
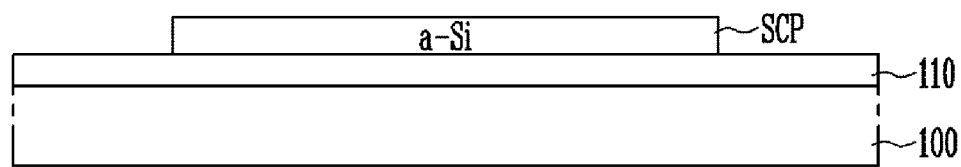

Referring to FIGS. 9B and 9C, after the semiconductor pattern SCP is formed, a crystallization process of crystallizing the semiconductor pattern SCP may be performed. For example, a laser irradiation apparatus 200 (e.g., a laser bar) is arranged over (e.g., disposed on) the base layer 100 on which the semiconductor pattern SCP is formed. The laser irradiation apparatus 200 may be moved along (or in) one direction (e.g., the first direction DR1) to irradiate a laser 201 and to crystallize the semiconductor pattern (e.g., each semiconductor pattern) SCP. As a result, a crystalline semiconductor pattern SCP including polysilicon (poly-Si) may be formed.

Referring to FIGS. 9D to 9F, the first insulating film 130 is formed on the semiconductor pattern SCP. According to an embodiment, the first insulating film 130 may have a different thickness for different regions (e.g., each region). For example, the first insulating film 130 may be formed to have different thicknesses at (e.g., in or on) a region in which the first driving transistor T1_1 is to be formed and at (e.g., in or on) a region in which the second driving transistor T1_2 is to be formed. In other words, the thickness of the first insulating film 130 at the region where the first driving transistor T1_1 is to be formed may be different from the thickness of the first insulating film 130 at the region where the second driving transistor T1_2 is to be formed.

For example, as shown in FIG. 9D, in order to form the first insulating film 130, an insulating material (e.g., at least one organic and/or inorganic material used to form the first insulating film 130) may be disposed (e.g., primarily applied) to cover the semiconductor pattern SCP to form an insulating material layer 130a. According to one or more exemplary embodiments, the insulating material layer 130a may be formed by depositing a desired insulating material on the base layer 110 on which the semiconductor pattern SCP is formed through various suitable methods, such as a chemical vapor deposition method, for example.

Next, as shown in FIG. 9E, a mask 300 is arranged over (e.g., disposed on) the base layer 100 on which the insulating material layer 130a is formed to expose (e.g., selectively expose) the region at (e.g., in or on) which the first driving transistor T1_1 is to be formed. Additional insulating material may be disposed (e.g., applied) on a region (e.g., one region) of the semiconductor pattern SCP corresponding to the region at (e.g., in or on) which the first driving transistor T1_1 is to be formed. For example, in a state in which the mask 300 is arranged over (e.g., disposed on) the base layer 100, the same or substantially the same insulating material as that used for forming the insulating material layer 130a may be additionally deposited on the exposed region at which the first driving transistor T1_1 is to be formed.

Accordingly, as shown in FIG. 9F, the first insulating film 130 having a different thickness at different regions (e.g., for each region) may be formed on the semiconductor pattern SCP. For example, the first insulating film 130 may have a first thickness t1 at (e.g., in or on) a region corresponding to an active layer pattern (e.g., the first active layer pattern 120_1 of FIG. 4) of the first driving transistor T1_1, and may have a second thickness t2 at (e.g., in or on) a region corresponding to an active layer pattern (e.g., the second active layer pattern 120_2 of FIG. 4) of the second driving transistor T1_2. The first thickness t1 may be greater than the second thickness t2.

Figure 9G:
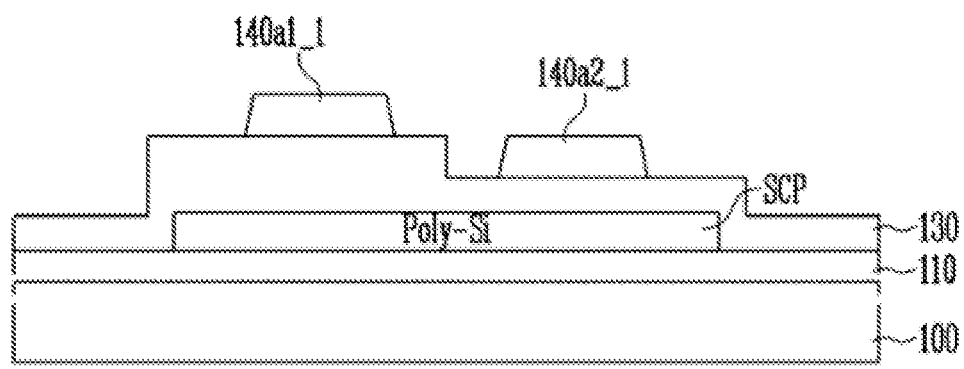

Referring to FIG. 9G, the gate electrode 140 is formed on the first insulating film 130 to overlap with a region (e.g., one region) of the semiconductor pattern SCP. For example, the first gate electrode 140a1 and the second gate electrode 140a2 (e.g., the lower electrodes 140a1_1 and 140a2_1 of the first and second gate electrodes 140a1 and 140a2) may be formed on the first insulating film 130 to overlap with different regions of the semiconductor pattern SCP from each other.

Figure 9H:
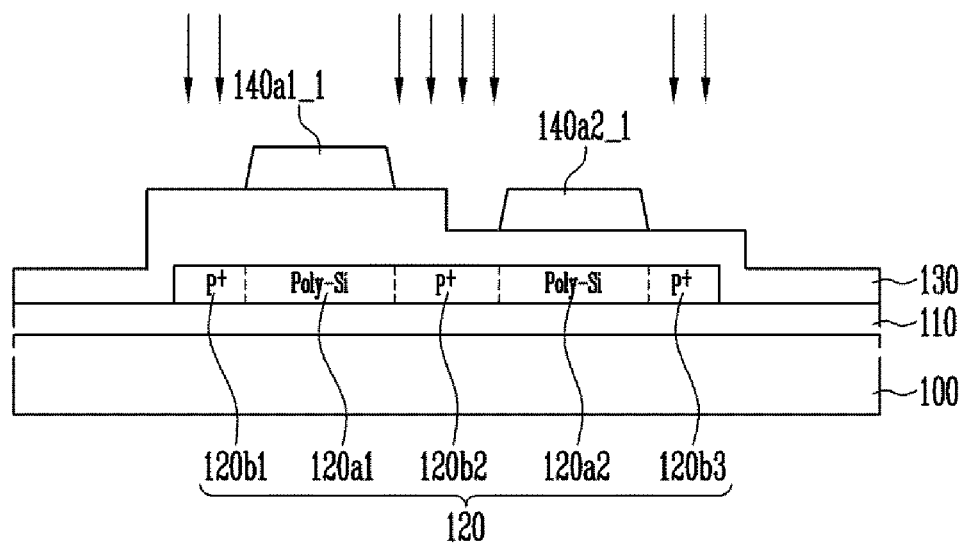

Referring to FIG. 9H, a doping process of doping (e.g., selectively doping) impurities into regions of the semiconductor pattern SCP is performed to form the first, second, and third conductive regions 120b1, 120b2, and 120b3. For example, by using the first and second gate electrodes 140a1 and 140a2 (e.g., the lower electrodes 140a1_1 and 140a2_1 of the first and second gate electrodes 140a1 and 140a2) as masks, suitable regions (e.g., the first, second, and third conductive regions 120b1, 120b2, and 120b3) of the semiconductor pattern SCP may be doped with impurities, except regions (e.g., the first and second channel regions 120a1 and 120a2) of the semiconductor pattern SCP that overlap with the first and second gate electrodes 140a1 and 140a2. Accordingly, the first and second channel regions 120a1 and 120a2 and the first, second, and third conductive regions 120b1, 120b2 and 120b3 may be divided, such that the active layer pattern 120 including the first and second channel regions 120a1 and 120a2 and the first, second, and third conductive regions 120b1, 120b2, and 120b3 may be formed.

According to one or more exemplary embodiments, the impurity used to dope the semiconductor pattern SCP may be a p-type impurity including, for example, boron (B) or the like. For example, boron (B) ions may be ion-implanted into the semiconductor pattern SCP in a desired dose amount of, for example, about $0.1E12/cm^2$ to about $7E12/cm^2$. However, the type and/or doping concentration of the impurity are not particularly limited to the example provided, and in other embodiments of the present invention, the type and/or doping concentration of the impurity may be variously modified according to (e.g., depending on) the type or characteristics of the first transistor T1. For example, in another exemplary embodiment, when the first transistor T1 is to be formed as an n-type transistor, one or more n-type impurities may be doped into the first, second, and third conductive regions 120b1, 120b2, and 120b3.

Figure 9I:
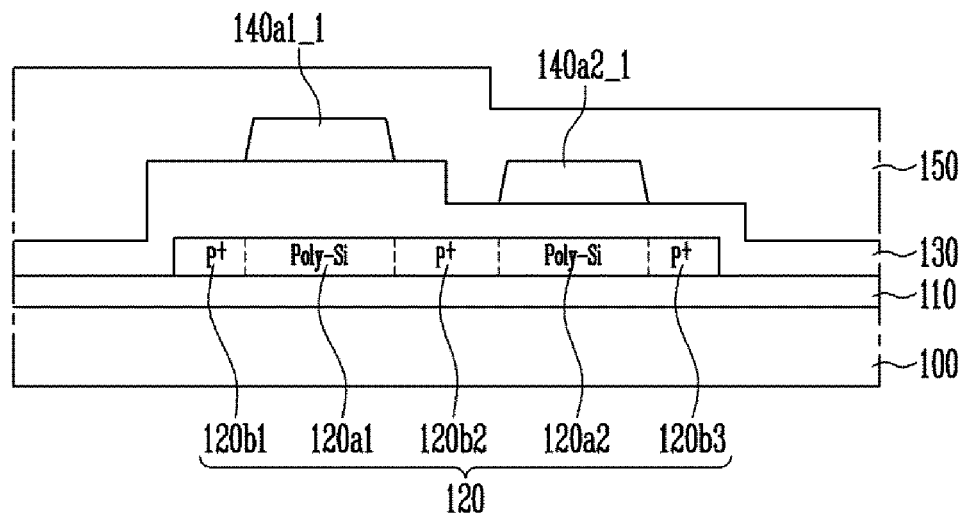

Referring to FIG. 9I, the second insulating film 150 is formed on the base layer 100 on which the gate electrodes (e.g., the lower electrodes 140a1_1 and 140a2_1 of the first and second gate electrodes 140a1 and 140a2) are formed. According to one or more exemplary embodiments, the second insulating film 150 may include (or may be) a second gate insulating film or an interlayer insulating film, and may be formed to include a single layer or multiple layers through a suitable process (e.g., a film forming process) of forming at least one layer of an insulating film and/or an inorganic insulating film. However, the material and/or physical properties of the second insulating film 150 are not particularly limited, and may be variously modified according to one or more exemplary embodiments. According to one or more exemplary embodiments, after the forming process of the second insulating film 150, a process of planarizing at least a portion of the second insulating film 150 may be performed through a chemical mechanical polishing process or the like.

Figure 9J:
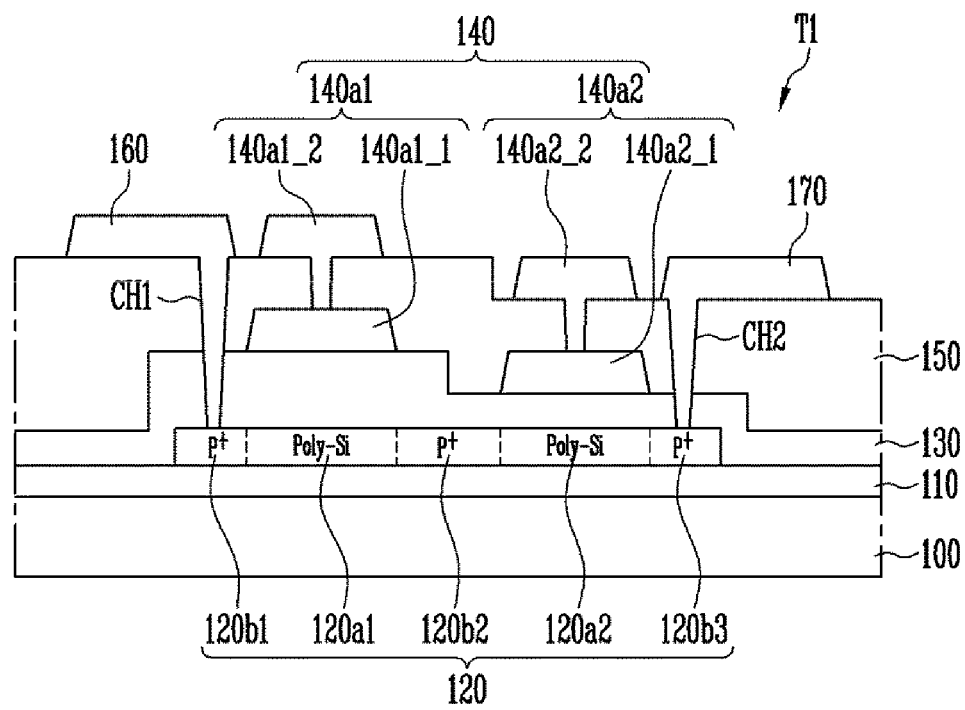

Referring to FIG. 9J, the first electrode 160 and the second electrode 170 are formed on the second insulating film 150, and connected to the first conductive region 120b1 and the third conductive region 120b3, respectively. In addition, when each of the gate electrodes (e.g., the first and second gate electrodes 140a1 and 140a2) has a multi-layered structure, the upper electrodes 140a1_2 and 140a2_2 of the first and second gate electrodes 140a1 and 140a2 may be formed concurrently with a process of forming the first electrode 160 and the second electrode 170.

According to the exemplary embodiment of FIGS. 4 and 9A to 9J, the first insulating film 130 may be formed to have different thicknesses for different regions (e.g., for each region) corresponding to the region in which the first driving transistor T1_1 is to be formed and the region in which the second driving transistor T1_2 is to be formed. Accordingly, the first driving transistor T1_1 and the second driving transistor T1_2 may be formed to have structures in a cross-sectional view that are asymmetric with each other. For example, in an exemplary embodiment, in the case where the first driving transistor T1_1 determines a driving range of the first transistor T1, a thickness of the first insulating film 130 serving as a gate insulating film for the first driving transistor T1_1 may be increased, thereby widening a driving range of the first transistor T1.

FIGS. 10A to 10J illustrate a method of manufacturing the display device 1 according to an exemplary embodiment of the present invention. For example, FIGS. 10A to 10J sequentially illustrate operations of manufacturing the first transistor T1 from among operations of manufacturing the display device 1, which includes the pixel PXL including the first transistor T1 (e.g., the first driving transistor T1_1 and the second driving transistor T1_2 that are connected in series with each other). In other words, in FIGS. 10A to 10J, a method of manufacturing the display device 1 will be described based on a method of manufacturing the first transistor T1 (e.g., according to the exemplary embodiment of FIG. 5). However, according to one or more exemplary embodiments, after a backplane layer BPL including the first transistor T1 is formed, a process of forming the display element layer DPL may be followed according to the exemplary embodiment of FIG. 8. In the description of the exemplary embodiments of FIGS. 10A to 10J, the same or similar (e.g., substantially the same) components as those of the above-described exemplary embodiments (e.g., the exemplary embodiments of FIGS. 9A and 9J) are denoted by the same reference symbols, and thus, redundant descriptions thereof may not be repeated.

Figure 10A:
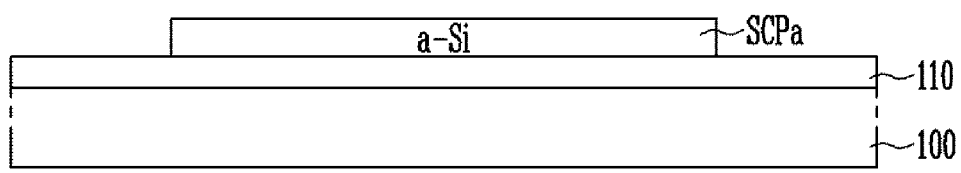
FIGS. 10A-10J illustrate a method of manufacturing a display device according to an exemplary embodiment of the present invention.
Figure 10B:
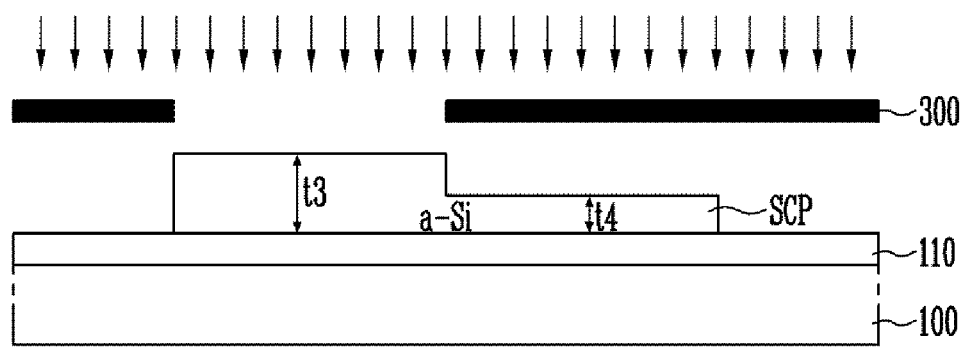
Figure 10C:
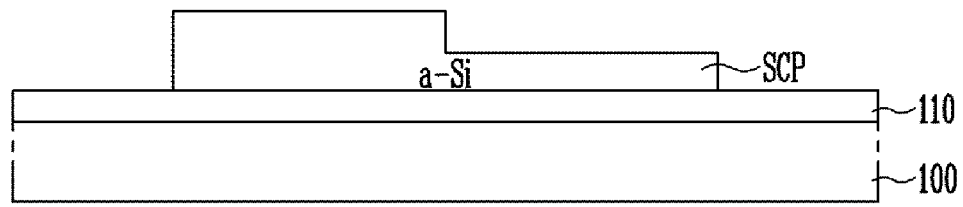

Referring to FIGS. 10A and 10C, after the buffer layer 110 is formed on the base layer 100, a semiconductor pattern SCP may be formed at (e.g., in or on) a transistor region (e.g., each transistor region) on the buffer layer 110 (e.g., a driving transistor region in which the first transistor T1 is to be disposed). However the present invention is not limited thereto, for example, when the buffer layer 110 is omitted, the semiconductor pattern SCP may also be formed on (e.g., directly on) one surface of the base layer 100.

According to one or more exemplary embodiments, the semiconductor pattern SCP may have different thicknesses for different regions (e.g., for each region). For example, the semiconductor pattern SCP may have different thicknesses in a region at (e.g., in or on) which the first driving transistor T1_1 is to be formed when compared to a region at (e.g., in or on) which the second driving transistor T1_2 is to be formed.

For example, in order to form the semiconductor pattern SCP, as shown in FIG. 10A, a semiconductor material layer SCPa may be formed by disposing (e.g., primarily applying) a semiconductor material (e.g., amorphous silicon (a-Si)) on the regions at (e.g., in or on) which the first and second driving transistors T1_1 and T1_2 are to be formed. For example, the buffer layer 110 and an amorphous silicon film are formed (e.g., sequentially formed) on the base layer 100, and then the amorphous silicon film may be patterned to form the semiconductor material layer (e.g., each semiconductor material layer) SCPa.

Next, as shown in FIG. 10B, a mask 300 is arranged over (e.g., disposed on) the base layer 100 on which the semiconductor material layer SCPa is formed to expose (e.g., selectively expose) the region at (e.g., in or on) which the first driving transistor T1_1 is to be formed. Additional semiconductor material may be disposed (e.g., applied) on the region of the semiconductor material layer SCPa corresponding to the region at (e.g., in or on) which the first driving transistor T1_1 is to be formed. For example, in a state in which the mask 300 is arranged over (e.g., disposed on) the base layer 100, the same or substantially the same semiconductor material as that used for forming the semiconductor material layer SCPa may be additionally deposited on the exposed region at which the first driving transistor T1_1 is to be formed.

Accordingly, as shown in FIGS. 10B and 10C, the semiconductor pattern SCP having different thicknesses for different regions (e.g., for each region) may be formed. For example, the semiconductor pattern SCP may have a third thickness t3 in a region at (e.g., in or on) which an active layer pattern (e.g., the first active layer pattern 120_1) of the first driving transistor T1_1 is to be formed, and a fourth thickness t4 in a region at (e.g., in or on) which an active layer pattern (e.g., the second active layer pattern 120_2) of the second driving transistor T1_2 is to be formed. The third thickness t3 may be greater than the fourth thickness t4.

Figure 10D:
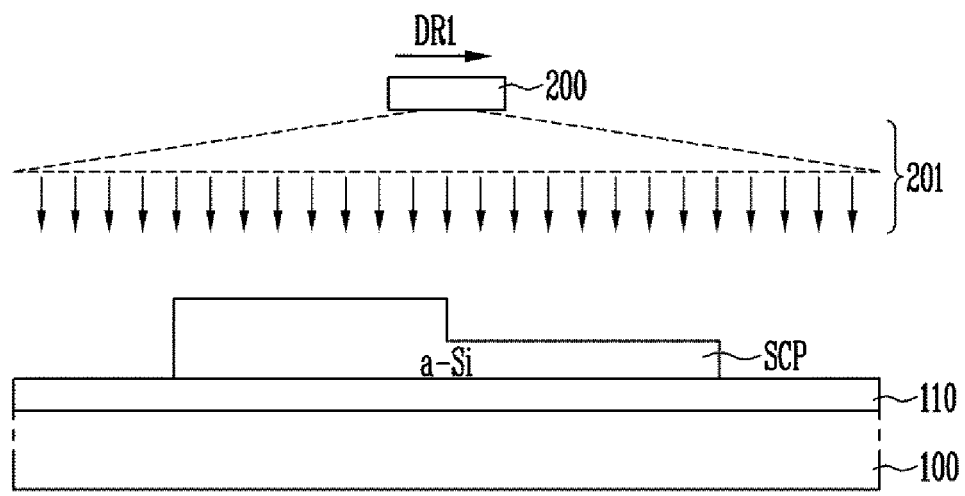
Figure 10E:
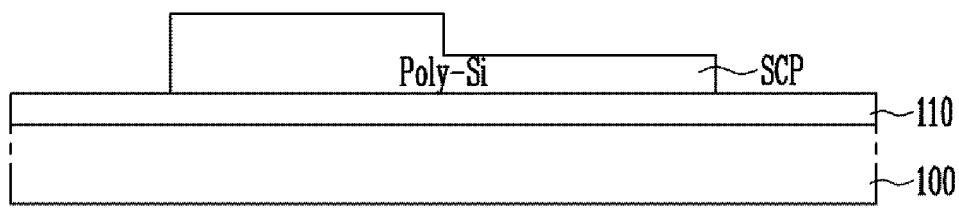

Referring to FIGS. 10D and 10E, after the semiconductor pattern SCP is formed, a crystallization process of crystallizing the semiconductor pattern SCP may be performed. For example, a laser 201 may be irradiated onto the semiconductor pattern SCP using a laser irradiation device 200, thereby crystallizing the semiconductor pattern SCP. As a result, a crystalline semiconductor pattern SCP including, for example, polysilicon (poly-Si) may be formed.

Figure 10F:
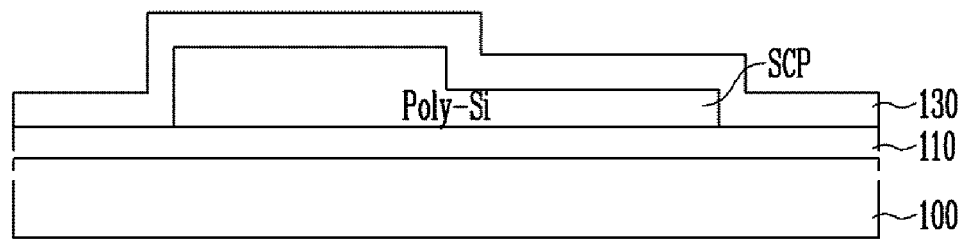

Referring to FIG. 10F, the first insulating film 130 is formed on the semiconductor pattern SCP. In an exemplary embodiment, the first insulating film 130 may have a uniform thickness. However, the present invention is not limited thereto. For example, in another exemplary embodiment, a thickness of each of the semiconductor pattern SCP and the first insulating film 130 may be formed differentially to correspond to the region at (e.g., in or on) which the active layer pattern (e.g., the first active layer pattern 120_1 of FIG. 5) of the first driving transistor T1_1 is to be formed and the region at (e.g., in or on) which the active layer pattern (e.g., the second active layer pattern 120_2 of FIG. 5) of the second driving transistor T1_2 is to be formed.

According to one or more exemplary embodiments, the first insulating film 130 may include at least one inorganic insulating film. In this case, the first insulating film 130 may have a surface profile corresponding to a surface profile of the active layer pattern SCP.

Figure 10G:
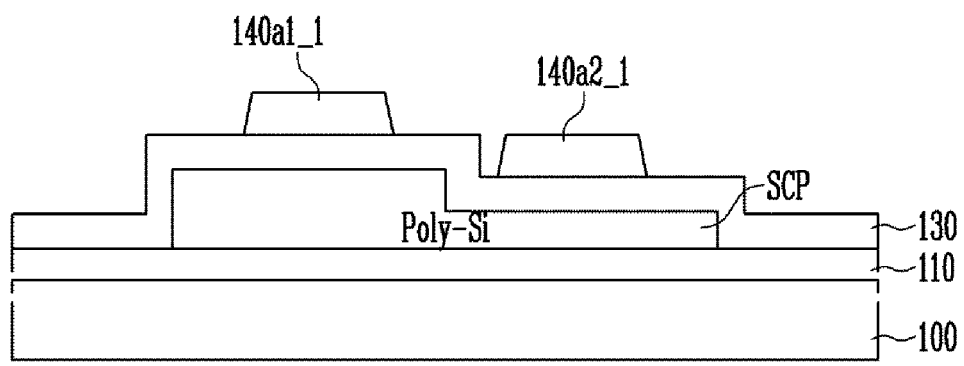

Referring to FIG. 10G, the gate electrode 140 is formed on the first insulating film 130 to overlap with a region (e.g., one region) of the semiconductor pattern SCP. For example, the first gate electrode 140a1 and the second gate electrode 140a2 (e.g., the lower electrodes 140a1_1 and 140a2_1 of the first and second gate electrodes 140a1 and 140a2) may be formed on the first insulating film 130 to overlap with different regions of the semiconductor pattern SCP.

Figure 10H:
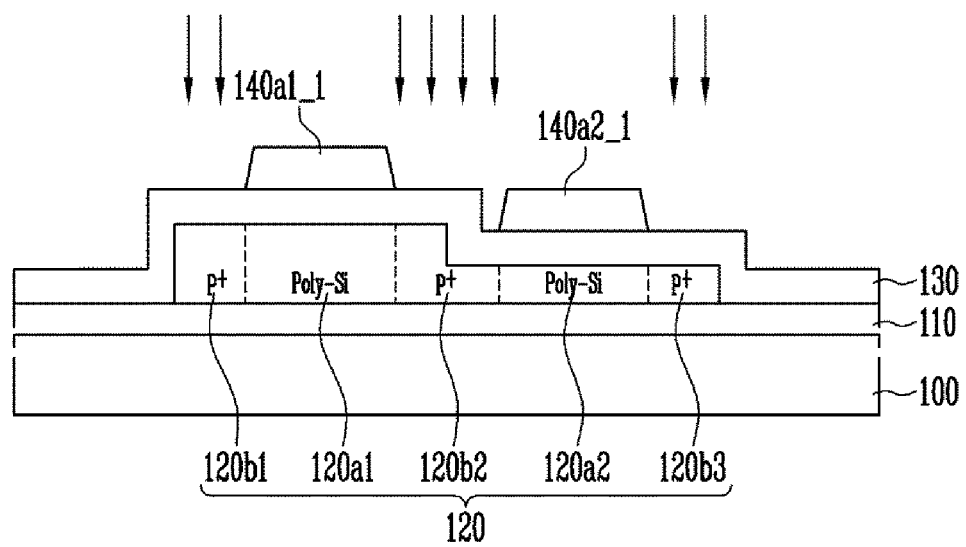

Referring to FIG. 10H, impurities are doped (e.g., selectively doped) into regions of the semiconductor pattern SCP to form the first, second, and third conductive regions 120b1, 120b2, and 120b3. Accordingly, the first and second channel regions 120a1 and 120a2 and the first, second, and third conductive regions 120b1, 120b2 and 120b3 may be divided, such that the active layer pattern 120 including the first and second channel regions 120a1 and 120a2 and the first, second, and third conductive regions 120b1, 120b2, and 120b3 may be formed.

Figure 10I:
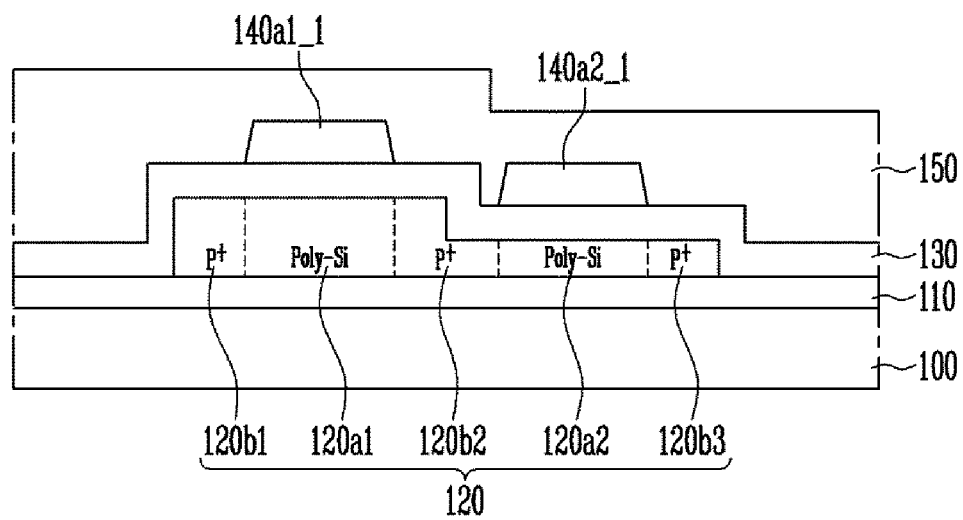

Referring to FIG. 10I, the second insulating film 150 is formed on the base layer 100 on which the gate electrodes (e.g., the lower electrodes 140a1_1 and 140a2_1 of the first and second gate electrodes 140a1 and 140a2) are formed. According to one or more exemplary embodiments, the second insulating film 150 may include (or may be) a second gate insulating film or an interlayer insulating film, and may be formed to include a single layer or multiple layers through a suitable process (e.g., a film forming process) of forming at least one layer of an insulating film and/or an inorganic insulating film.

Figure 10J:
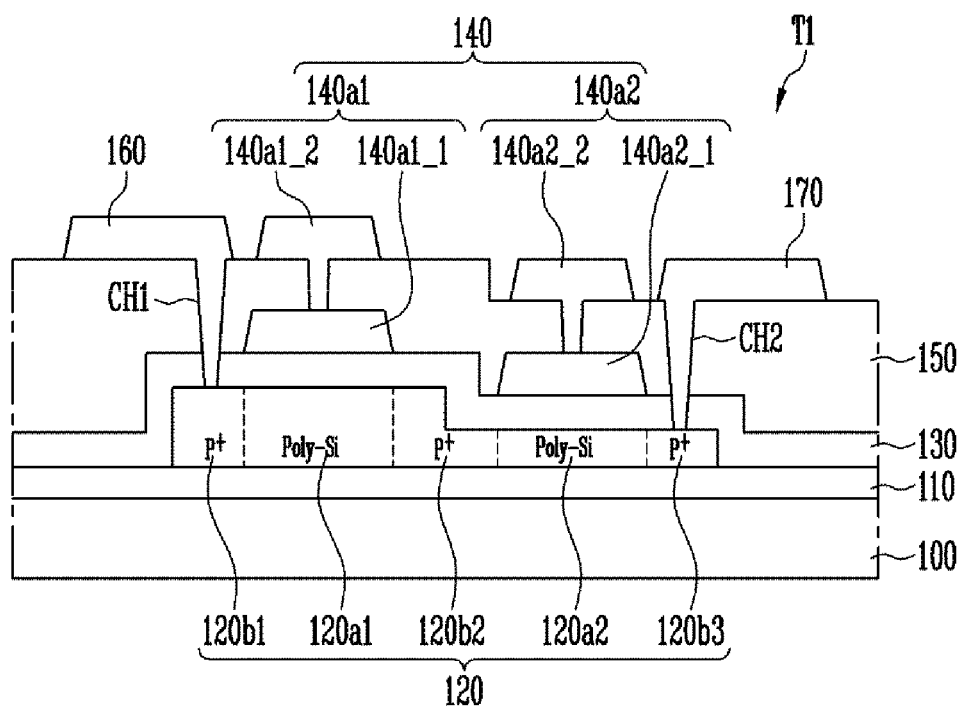

Referring to FIG. 10J, the first electrode 160 and the second electrode 170 are formed on the second insulating film 150. In addition, when each of the gate electrodes (e.g., the first and second gate electrodes 140a1 and 140a2) has a multi-layered structure, the upper electrodes 140a1_2 and 140a2_2 of the first and second gate electrodes 140a1 and 140a2 may be formed concurrently with a process of forming the first electrode 160 and the second electrode 170.

According to the exemplary embodiment of FIGS. 5 and 10A to 10J, the semiconductor pattern SCP is formed to have different thicknesses for different regions (e.g., for each region) corresponding to the region at (e.g., in or on) which the first driving transistor T1_1 is to be formed and the region at (e.g., in or on) which the second driving transistor T1_2 is to be formed. Accordingly, the first driving transistor T1_1 and the second driving transistor T1_2 may be formed to have structures in a cross-sectional view that are asymmetric with each other. For example, the thickness of the semiconductor pattern SCP may be increased with respect to the region at (e.g., in or on) which the first active layer pattern 120_1 is to be formed, thereby widening a driving range of the first transistor T1.

According to a display device and a method of manufacturing the same according to one or more exemplary embodiments of the present invention, a driving range of a driving transistor provided at (e.g., in or on) each pixel may be sufficiently secured, and/or an area occupied by the driving transistor may be reduced. In addition, element characteristics of a plurality of transistors defining (e.g., forming or constituting) the driving transistor may be individually adjusted to improve or optimize driving characteristics of the driving transistor.

While one or more exemplary embodiments have been described with reference to the figures, it should be understood that the exemplary embodiments described herein should be considered in a descriptive sense only and not for purposes of limitation. Thus, descriptions of features or aspects within each exemplary embodiment should typically be considered as available for other similar features or aspects in other exemplary embodiments. Accordingly, it will be understood by those of ordinary skill in the art that various modifications in form and details may be made therein without departing from the spirit and scope of the present invention as defined by the following claims, and their equivalents.

What is claimed is:

1. A display device comprising:
a pixel at a display region, the pixel comprising:
   a light-emitting element connected between a first power source and a second power source; and
   a first transistor connected between the first power source and the light-emitting element, the first transistor configured to control a driving current of the light-emitting element in response to a voltage of a first node,
wherein the first transistor comprises a first driving transistor and a second driving transistor that are connected in series with each other between the first power source and the light-emitting element, and
wherein the first driving transistor and the second driving transistor have structures that are asymmetric with each other in a cross-sectional view.

2. The display device of claim 1, wherein at least one of a thickness of a channel region and a thickness of a gate insulating film of the first driving transistor is different from that of the second driving transistor.

3. The display device of claim 1, wherein the first transistor comprises:
a first channel region;
a first conductive region and a second conductive region at opposite sides of the first channel region from each other;
a second channel region spaced from the first channel region with the second conductive region interposed therebetween;
a third conductive region spaced from the second conductive region with the second channel region interposed therebetween;
a first gate electrode overlapping the first channel region with a first insulating film interposed therebetween; and
a second gate electrode overlapping the second channel region with the first insulating film interposed therebetween.

4. The display device of claim 3, wherein:
the first driving transistor comprises a first active layer pattern, and is connected between the first power source and the second driving transistor, the first active layer pattern comprising the first channel region, the first conductive region, and the second conductive region; and
the second driving transistor comprises a second active layer pattern, and is connected between the first driving transistor and the light-emitting element, the second active layer pattern comprising the second channel region, the second conductive region, and the third conductive region.

5. The display device of claim 4, wherein the first insulating film has a first thickness between the first channel region and the first gate electrode, and a second thickness between the second channel region and the second gate electrode, the second thickness being less than the first thickness.

6. The display device of claim 4, wherein a thickness of the first channel region is greater than a thickness of the second channel region.

7. The display device of claim 4, wherein a length of the first channel region is greater than a length of the second channel region.

8. The display device of claim 4, wherein the first active layer pattern and the second active layer pattern are integrally connected to each other through the second conductive region.

9. The display device of claim 3, wherein the first gate electrode and the second gate electrode are commonly connected to the first node.

10. The display device of claim 3, wherein the first transistor further comprises:
   a first electrode connected to the first conductive region; and
   a second electrode connected to the third conductive region.

11. The display device of claim 1, wherein the pixel further comprises at least one switching transistor configured to transmit a data signal or a voltage of an initialization power source to the first node.

12. The display device of claim 11, wherein the switching transistor comprises a plurality of transistors connected in series with each other.

* * * * *